US011164984B2

United States Patent
Kang et al.

(10) Patent No.: US 11,164,984 B2
(45) Date of Patent: Nov. 2, 2021

(54) INTERCONNECTING MEMBER FOR SOLAR CELL PANEL AND SOLAR CELL PANEL INCLUDING THE SAME

(71) Applicant: LG ELECTRONICS INC., Seoul (KR)

(72) Inventors: Woojoong Kang, Seoul (KR); Dongju Kang, Seoul (KR); Jangho Kim, Seoul (KR); Juseok Kim, Seoul (KR); Hyunjin Kim, Seoul (KR); Kwangkyu Song, Seoul (KR); Yihwan Jung, Seoul (KR); Yunhui Cho, Seoul (KR); Minseok Choi, Seoul (KR); Hyeonbum Jin, Seoul (KR)

(73) Assignee: LG ELECTRONICS INC., Seoul (KR)

(*) Notice: Subject to any disclaimer, the term of this patent is extended or adjusted under 35 U.S.C. 154(b) by 107 days.

(21) Appl. No.: 16/362,000

(22) Filed: Mar. 22, 2019

(65) Prior Publication Data

US 2019/0296172 A1    Sep. 26, 2019

(30) Foreign Application Priority Data

Mar. 22, 2018   (KR) .................. 10-2018-0033238
Jun. 11, 2018   (KR) .................. 10-2018-0066909
Mar. 14, 2019   (KR) .................. 10-2019-0029419

(51) Int. Cl.
*H01L 31/05*   (2014.01)
*H01L 31/054*   (2014.01)

(52) U.S. Cl.
CPC ...... *H01L 31/0508* (2013.01); *H01L 31/0512* (2013.01); *H01L 31/0547* (2014.12)

(58) Field of Classification Search
CPC . H01L 31/05; H01L 31/0508; H01L 31/0512; H01L 31/0547
See application file for complete search history.

(56) References Cited

U.S. PATENT DOCUMENTS

| | | | | |
|---|---|---|---|---|
| 2009/0077797 | A1* | 3/2009 | Berghofer | H01R 13/03 29/832 |
| 2013/0125953 | A1* | 5/2013 | Taira | H01L 31/0512 136/244 |
| 2016/0126389 | A1* | 5/2016 | Zhao | H01L 31/02008 136/251 |

(Continued)

FOREIGN PATENT DOCUMENTS

| | | |
|---|---|---|
| EP | 2 472 597 A1 | 7/2012 |
| EP | 3 128 561 A1 | 2/2017 |
| EP | 3 188 257 A1 | 7/2017 |

(Continued)

*Primary Examiner* — Mayla Gonzalez Ramos
(74) *Attorney, Agent, or Firm* — Birch, Stewart, Kolasch & Birch, LLP

(57) ABSTRACT

An interconnecting member of a solar cell panel for connecting a plurality of solar cells, can include a core layer and a solder layer formed on a surface of the core layer, in which the core layer includes a protruding portion having a peak portion extending along a longitudinal direction of the core layer, and a reflection surface having an inclined surface or a rounded portion disposed at opposite sides of the peak portion, and a width of the protruding portion increases from the peak portion towards a center of the core layer.

20 Claims, 13 Drawing Sheets

(56) References Cited

U.S. PATENT DOCUMENTS

2017/0186899 A1\* 6/2017 Kim .................. H01L 31/0508
2018/0083152 A1\* 3/2018 Yoshikawa ......... H01L 31/0504

FOREIGN PATENT DOCUMENTS

| JP | 2007-157881 A | 6/2007 |
| JP | 2010-283138 A | 12/2010 |
| JP | 2011-49349 A | 3/2011 |
| JP | 2011-129641 A | 6/2011 |
| JP | 2012-182271 A | 9/2012 |
| JP | 2016-72096 A | 5/2016 |
| JP | 2017-38050 A | 2/2017 |
| JP | 2017-120906 A | 7/2017 |
| KR | 10-2008-0026568 A | 3/2008 |
| KR | 10-2017-0017576 A | 2/2017 |

\* cited by examiner (a)

(b)

(a)

(b)

(a)

(b)

INTERCONNECTING MEMBER FOR SOLAR CELL PANEL AND SOLAR CELL PANEL INCLUDING THE SAME

CROSS-REFERENCE TO RELATED APPLICATION

This application claims priority to and the benefit of Korean Patent Application No. 10-2018-0033238 filed on Mar. 22, 2018 in the Republic of Korea, Korean Patent Application No. 10-2018-0066909 filed on Jun. 11, 2018 in the Republic of Korea, and Korean Patent Application No. 10-2019-0029419 filed on Mar. 14, 2019 in the Republic of Korea, the entire contents of which are incorporated herein by reference.

BACKGROUND OF THE INVENTION

Field of the Invention

Embodiments of the invention relate to an interconnecting member for a solar cell panel and a solar cell panel including the same, and, more particularly, to an interconnecting member for a solar cell panel having an improved structure and a solar cell panel including the same.

Description of the Related Art

A plurality of solar cells are connected in series or in parallel by an interconnecting member, and are manufactured in a form of a solar cell panel by a packaging process for protecting a plurality of solar cells. As a structure and a number of an interconnecting member applied to a solar cell panel are changed, it is required to improve a shape of the interconnecting member so as to cope with this.

For example, if an interconnecting member has a small width or a rounded portion and thus has a relatively small attaching or contacting area than the conventional interconnecting member having a quadrangular shape, a resistance property may be degraded and an output of a solar cell panel may be lowered. Alternatively, an adhesive layer for attaching the interconnecting member may not be uniformly applied due to a surface tension caused by the small width or the rounded portion, and then, an adhesion property may be deteriorated and an output of the solar cell panel may be lowered. Accordingly, in order to improve an output of a solar cell panel having an interconnecting member having the small width or the rounded portion, it is required to improve a shape of an interconnecting member so as to enhance an output of a solar cell panel through reducing resistance of an interconnecting member or to maximize an amount of light incident to a solar cell panel by a reflection.

SUMMARY OF THE INVENTION

Therefore, embodiments of the invention have been made in view of the above problems, and embodiments of the invention are to provide an interconnecting member of a solar cell panel having an improved structure to enhance an output of a solar cell panel, and a solar cell panel including the same.

In particular, embodiments of the invention are to provide an interconnecting member of a solar cell panel having a shape capable of reducing resistance in an interconnecting member having a small width or a rounded portion and a solar cell panel including the same. In this instance, embodiments of the invention are to provide an interconnecting member of a solar cell panel that includes a core layer and a solder layer and it is possible to improve a structure of the interconnecting member which can change a volume or surface area of the solder layer according to a shape of the core layer, thereby increasing the volume or surface area of the solder layer, and a solar cell panel including the same.

According to another aspect of the invention, embodiments of the invention are to provide an interconnecting member of a solar cell panel being able to allow light to be reflected at an interconnecting member and then reflected again at a cover member in order to maximize an amount of light incident to a solar cell and enhance an output of a solar cell panel by changing a shape of the interconnecting member, and a solar cell panel including the same.

An interconnecting member of a solar cell panel for connecting a plurality of solar cells includes a core layer and a solder layer formed on a surface of the core layer. The core layer has a protruding portion or a corner portion having a peak portion extending in a longitudinal direction of the core layer and a reflection surface formed of an inclined surface or a rounded portion at both sides of the peak portion so that a width of the protruding portion or the corner portion increases from the peak portion to a center of the core layer.

For example, the core layer may have the protruding portion including the rounded portion or a curved surface as the reflection surface. A defective rate of the interconnecting member can be reduced by the protruding portion including the rounded portion and an attaching area with an electrode can be maximized while minimizing damage to the electrode. Particularly, it is possible to effectively reduce a defective rate of the interconnecting member including a circular shape or a rounded portion and having a small width. When viewed in a cross-sectional view, the core layer may include a central portion having a rounded shape and the protruding portion including a plurality of protruding portions disposed at an outer side of the central portion. The protruding portion may have a maximum height smaller than a maximum width or a maximum diameter of the central portion. The central portion and the plurality of protrusions may form an integral structure, and the core layer having the plurality of protrusions may be formed of a single body.

The maximum height of the protruding portion may be greater than a thickness of the solder layer.

The central portion may have a circular shape having a first curvature radius and the protruding portion may have a rounded shape having a second curvature radius smaller than the first curvature radius. The core layer may include a depressed portion or a valley between the plurality of protruding portions. A protruding end of the protruding portion, the depressed portion, or the valley may have a rounded shape.

The maximum height of the protruding portion may be smaller than a maximum width of a lower portion of the protruding portion adjacent to the central portion. Alternatively, a ratio of the maximum height of the protruding portion to the maximum width of the lower portion of the protruding portion adjacent to the central portion may be 0.05 to 0.7.

A ratio of the maximum height of the protruding portion to a diameter of the core layer may be 0.05 to 0.4. Alternatively, a diameter of the core layer may be 200 to 600 μm and the maximum height of the protruding portion may be 60 to 120 μm.

The protruding portion may include four to twelve protruding portions in the interconnecting member when viewed in a cross-section. In this instance, the plurality of protruding portions may be regularly positioned at regular distances in the interconnecting member when viewed in a cross-section.

A ratio of a thickness of the solder layer to the maximum height of the protruding portion may be 0.001 to 0.3. Alternatively, the maximum height of the protruding portion may be 60 to 120 μm and a thickness of the solder layer may be 1 to 10 μm.

A thickness of the solder layer located on a depressed portion of the protruding portion may be larger than a thickness of the solder layer located on a protruding end of the protruding portion. When viewed in a cross-section, an outer surface of the solder layer may have a circular shape.

As another example, a second surface of the solder layer located on a depressed portion of the protruding portion may be closer to a center of the core layer than a first surface of the solder layer located on a protruding end of the protruding portion.

As another example, the core layer may have the corner portion. The reflection surface connected to the peak portion may include two inclined surfaces crossing each other and the corner portion may be formed of an obtuse-angled corner portion having an obtuse angle. The core layer may include a plurality of obtuse-angled corner portions and may have a polygonal shape.

The core layer may include five to twelve obtuse-angled corner portions and may have a pentagon shape to a dodecagon shape.

The plurality of obtuse-angled corner portions each may have a shape extending in a longitudinal direction of the interconnecting member, and the core layer has a flat plane portion between two adjacent obtuse-angled corner portions of the plurality of obtuse-angled corner portions.

Distances from a center of the core layer to the plurality of obtuse-angled corner portions may be substantially the same when viewed in a cross-section. Central angles between a center of the core layer and two adjacent obtuse-angled corner portions among the plurality of obtuse-angled corner portions may be substantially the same when viewed in a cross-section.

An outer surface of the solder layer may have a circular shape or may have a polygonal shape including a plurality of obtuse-angled corner portions corresponding to the plurality of obtuse-angled corner portions of the core layer when viewed in a cross-section.

The core layer may have a width of 200 to 600 μm and the solder layer may have a thickness of 1 to 10 μm.

The core layer may include a base surface, first and second corner surfaces, the reflection surface including first and second inclined reflection surfaces, and a third corner surface. The first and second corner surfaces may be connected to both sides of the base surface, and a distance between the first and second corner surfaces may increase as a distance to the base surface increases. The first and second inclined reflection surfaces may be connected to the first and second corner surfaces, respectively, and be inclined in opposite directions to each other so that a distance between the first and second inclined reflection surfaces decreases as a distance to the base surface increases. The third corner surface may connect the first and second inclined reflection surfaces, be parallel to the base surface, and form the peak portion. Widths of the first, second, and third corner surfaces may be smaller than widths of the first and second inclined reflection surfaces.

The first, second, and third corner surfaces may have a first width equal to each other. The first and second inclined reflection surfaces and the base surface may have a second width equal to each other. The interconnecting member may have a symmetrical structure.

A ratio of the width of the first, second, or third corner surface to the width of the first or second inclined reflection surface may be 0.1 to 0.9.

A solar cell panel according to an embodiment includes a plurality of solar cells, and an interconnecting member for connecting the plurality of solar cells. The interconnecting member includes a core layer and a solder layer formed on a surface of the core layer. The core layer has a protruding portion or a corner portion having a peak portion extending in a longitudinal direction of the core layer and a reflection surface formed of an inclined surface or a rounded portion at both sides of the peak portion so that a width of the protruding portion or the corner portion increases from the peak portion to a center of the core layer.

For example, the core layer may have the protruding portion including the rounded portion or a curved surface as the reflection surface. When viewed in a cross-sectional view, the core layer may include a central portion having a rounded shape and the protruding portion including a plurality of protruding portions disposed at an outer side of the central portion. The protruding portion may have a maximum height smaller than a maximum width or a maximum diameter of the central portion.

The core layer may include a depressed portion or a valley between the plurality of protruding portions. The depressed portion or the valley may have a rounded shape or a curved surface.

The solar cell may include a photoelectric conversion portion, and an electrode formed on the photoelectric conversion portion and including a pad portion to which the interconnecting member is attached. At least two of the plurality of protruding portions of the interconnecting member may be attached to the pad portion by the solder layer.

The solar cell may include a photoelectric conversion portion, and an electrode formed on the photoelectric conversion portion and including a pad portion to which the interconnecting member is attached. A thickness of the solder layer between the pad portion and the core layer at a portion of the solder layer attached to the solar may be greater than a thickness of another portion of the solder layer located on a protruding end of the protruding portion, which is positioned at an opposite side to the portion, and a thickness of other portion of the solder layer located on a depressed portion between the plurality of protruding portions.

A width of the solder layer may gradually increase toward the pad portion at a portion adjacent to the pad portion.

The protruding portion may have a maximum height smaller than a maximum width or a maximum diameter of the central portion.

As another example, the core layer may have the corner portion. The reflection surface connected to the peak portion may include two inclined surfaces crossing each other and the corner portion may be formed of an obtuse-angled corner portion having an obtuse angle. The core layer may include a plurality of obtuse-angled corner portions and may have a polygonal shape.

The core layer may include five to twelve obtuse-angled corner portions and may have a pentagon shape to a dodecagon shape.

The plurality of obtuse-angled corner portions each may have a shape extending in a longitudinal direction of the interconnecting member, and the core layer may have a flat plane portion between two adjacent obtuse-angled corner portions of the plurality of obtuse-angled corner portions.

The solar cell may include a photoelectric conversion portion, and an electrode formed on the photoelectric conversion portion and including a pad portion to which the interconnecting member is attached. The flat plane portion of the core layer may be closest to the pad portion and attached to the pad portion in parallel.

The core layer may include a base surface, first and second corner surfaces, the reflection surface including first and second inclined reflection surfaces, and a third corner surface. The first and second corner surfaces may be connected to both sides of the base surface, and a distance between the first and second corner surfaces may increase as a distance to the base surface increases. The first and second inclined reflection surfaces may be connected to the first and second corner surfaces, respectively, and be inclined in opposite directions to each other so that a distance between the first and second inclined reflection surfaces decreases as a distance to the base surface increases. The third corner surface may connect the first and second inclined reflection surfaces, be parallel to the base surface, and form the peak portion. Widths of the first, second, and third corner surfaces may be smaller than widths of the first and second inclined reflection surfaces. The solder layer may include a first portion having a rounded shape and covering the third corner surface and the first and second inclined reflection surfaces, and a second portion formed at a portion where the first and second inclined reflection surfaces and the base surface are located and having a shape protruding outward than the first portion.

According to the embodiment, optical loss can be minimized by scattered reflection or the like using an interconnecting member of a wire shape, and a movement path of carrier can be reduced by increasing a number of interconnecting members and reducing pitches of the interconnecting member. In addition, a width or a diameter of the interconnecting member is reduced, and thus, a material cost can be greatly reduced. Thus, an efficiency of the solar cell and an output of the solar cell panel can be improved.

In this instance, according to an embodiment, a core layer of an interconnecting member includes the plurality of protruding portions, and thus, a volume or a surface area of a solder layer formed on a surface of a plurality of protruding portions can be effectively increased. Thus, an attaching property of the interconnecting member can be improved and resistance can be reduced. An amount of light reflected by the plurality of protruding portions to be re-incident to a solar cell can be increased and thus an amount of light used for photoelectric conversion can be increased. The plurality of protruding portions may be formed as an integral structure as a part of a core layer so that the core layer may be formed of a single body to improve a structural stability. Thus, an output and a reliability of the solar cell panel can be improved. The effect can be greatly enhanced when the structure is applied to the interconnecting, member that may have a small attaching area by a small width and a rounded portion and thus may have high resistance.

According to another embodiment of the invention, light is reflected at the interconnecting member having a small width at an angle such that the reflected light can be re-reflected at a cover member and be re-incident to a solar cell. Therefore, an amount of light incident to a solar cell can be maximized, and an output of a solar cell panel can be improved.

According to yet another embodiment, a core layer has a large contact area by a base surface and first and second inclined reflection surfaces having a relatively large width, thereby improving a contact property and sufficiently realizing light reflection. The core layer includes first to third corner surfaces between the base surface and the first and second inclined reflection surfaces, and thus, a problem such as deterioration of a contact property due to a sharp corner or an angular corner can be prevented. Thus, an output and a reliability of a solar cell panel can be improved.

DETAILED DESCRIPTION OF THE EMBODIMENTS

Figure 1:
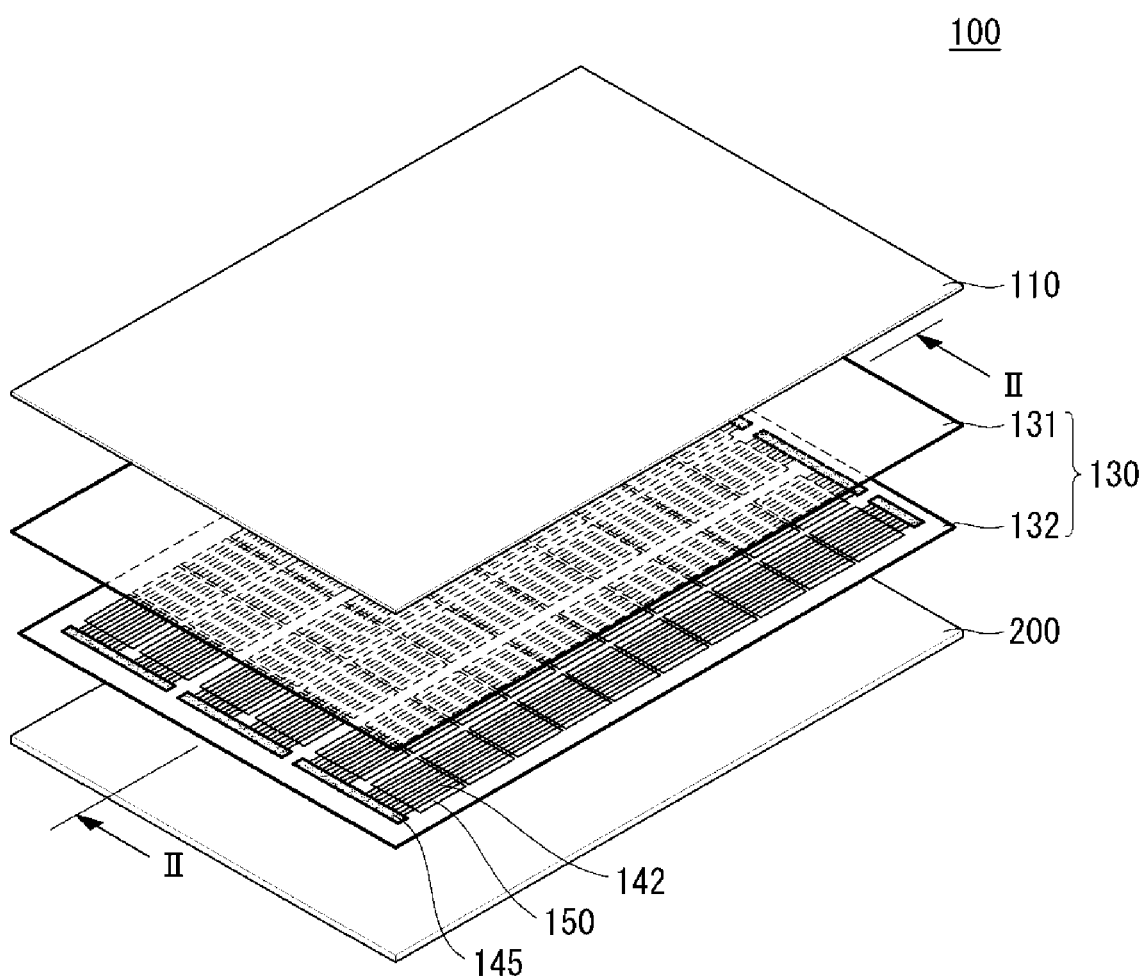
FIG. 1 is a perspective view showing a solar cell panel according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, an interconnecting member for a solar cell panel and a solar cell panel including the same according to an embodiment of the invention will be described in detail with reference to the accompanying drawings. For a clear explanation, a solar cell panel including an interconnecting member according to an embodiment will be described first, and then, structures of an interconnecting member according to the embodiment before being attached or after being attached will be described. Hereinafter, terms of "first", "second", and the like are used for distinguishing elements between each other, and embodiments of the invention are not limited thereto.

Figure 2:
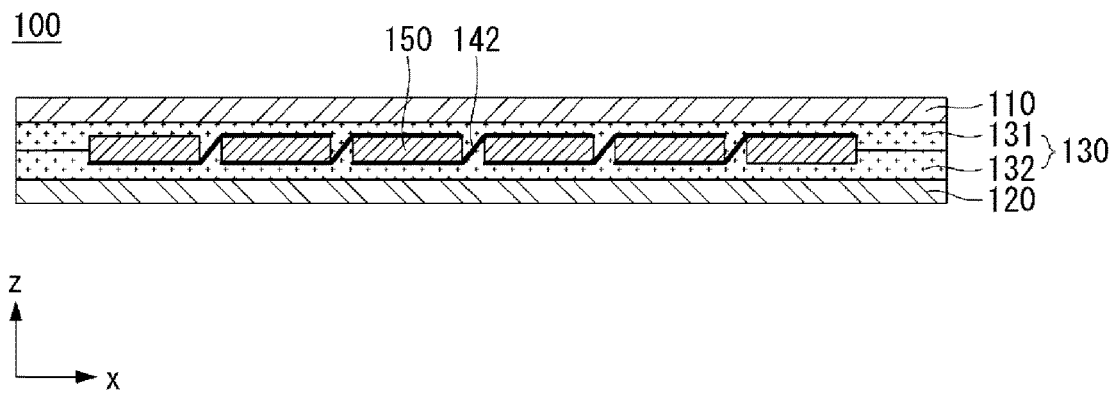
FIG. 2 is a cross-sectional view taken along line II-II of FIG. 1.

FIG. 1 is a perspective view showing a solar cell panel according to an embodiment of the invention, and FIG. 2 is a cross-sectional view taken along line II-II of FIG. 1.

Referring to FIGS. 1 and 2, a solar cell panel 100 according to an embodiment includes a plurality of solar cells 150 and interconnecting members (wires, wiring members, interconnectors, interconnecting members, or so on) 142 for electrically connecting the plurality of solar cells 150. The solar cell panel 100 may include a sealing member 130 that surrounds and seals the plurality of solar cells 150 and the interconnecting members 142 for connecting the plurality of solar cells 150, a first cover member 110 positioned at a front surface of the solar cell 150 on the sealing member 130, and a second cover member 120 positioned at a back surface of the solar cell 150 on the sealing member 130. This will be described in more detail.

First, the solar cell 150 may include a photoelectric conversion portion that converts solar energy into electric energy, and an electrode electrically connected to the photoelectric conversion portion to collect and deliver current. A plurality of solar cells 150 may be electrically connected in series, parallel, or series-parallel by the interconnecting member 142. Specifically, the interconnecting member 142 electrically connects two neighboring solar cells 150 among the plurality of solar cells 150.

A bus ribbon 145 may be connected to the interconnecting members 142 positioned at ends of a solar cell string, which is a column of the plurality of solar cells 150 connected through the interconnecting members 142, and may extend in direction crossing the solar cell string. For example, bus ribbons 145 may connect opposite ends of a plurality of solar cell strings in an alternating manner. The bus ribbons 145 may connect adjacent ones of solar cell strings, or connect the solar cell string to a junction box for preventing reversal of current. A material, a shape, and a connection structure of the bus ribbons 145 may be varied and thus embodiments of the invention are not limited thereto.

The sealing member 130 may include a first sealing member 131 disposed on the front surfaces of the solar cells 150 connected to each other by the interconnecting members 142, and a second sealing member 132 disposed on the back surfaces of the solar cells 150 connected to each other by the interconnecting members 142. The first sealing member 131 and the second sealing member 132 block a permeation of moisture or oxygen, and chemically combine elements constituting the solar cell panel 100. For the first sealing member 131 and the second sealing member 132, an insulating material having a transparent property and an adhesive property may be used. As an example, ethylene vinyl acetate (EVA) copolymer resin, polyvinyl butyral, silicone resin, ester-based resin, olefin-based resin, or the like may be used for the first sealing member 131 and the second sealing member 132. The second cover member 120, the second sealing member 132, the solar cells 150, the first sealing member 131, the first cover member 110 or so on may have an integrated structure to form the solar cell panel 100 through a lamination process using the first sealing member 131 and the second sealing member 132.

The first cover member 110 is disposed on the first sealing member 131 and constitutes a front surface of the solar cell panel 100. The second cover member 120 is disposed on the second sealing member 132 and constitutes a back surface of the solar cell panel 100. The first cover member 110 and the second cover member 120 may be made of an insulating material capable of protecting the solar cells 150 from external impact, moisture, ultraviolet, or so on. Also, the first cover member 110 may be made of an optically-transparent material that light can be transmitted through. The second cover member 120 may be a sheet made of an optically-transparent material, a non-optically-transparent material, a reflective material, or the like. For example, the first cover member 110 may be a glass substrate. The second cover member 120 may have a Tedlar/PET/Tedlar (TPT) type or may have a structure in which a layer of polyvinylidene fluoride (PVDF) resin or the like is formed on at least one surface of a base layer (e.g., polyethylene terephthalate (PET)).

However, embodiments of the invention are not limited thereto. Thus, the first sealing member 131 and the second sealing member 132, the first cover member 110, or the second cover member 120 may be made of any of various materials other than the above materials and may have any of various structures other than the above structures. For example, the first cover member 110 or the second cover member 120 may have any of various structures (e.g., a substrate, a film, a sheet, or so on) or any of various materials.

Figure 3:
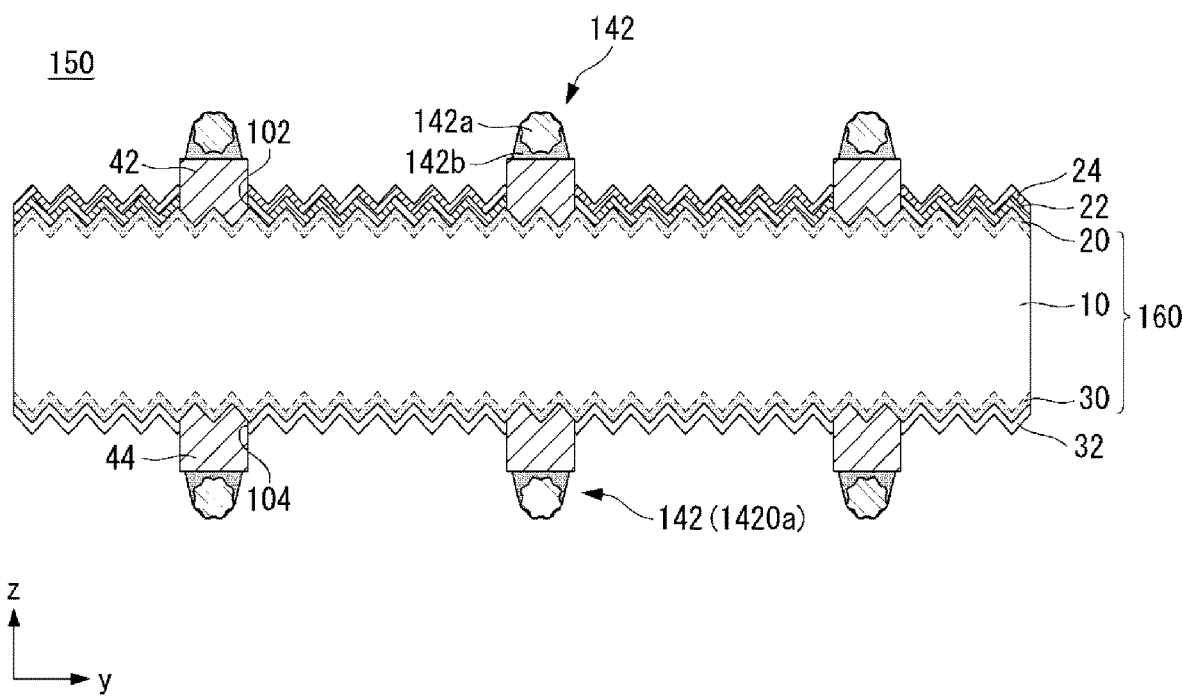
FIG. 3 is a partial cross-sectional view of a solar cell and interconnecting members connected thereto, which are included in the solar cell panel shown in FIG. 1.

An example of the solar cell 150 and the interconnecting members 142 connected to the same will be described in more detail with reference to FIG. 3. FIG. 3 is a partial cross-sectional view of the solar cell 150 and the interconnecting members 142 connected thereto, which are included in the solar cell panel 100 shown in FIG. 1.

Referring to FIG. 3, the solar cell 150 may include a semiconductor substrate 160, a conductive region 20 or 30 formed on or formed at the semiconductor substrate 160, and an electrode 42 or 44 connected to the conductive region 20 or 30. The conductive region 20 or 30 may include a first conductive region 20 having a first conductivity type and a second conductive region 30 having a second conductivity type. The electrode 42 or 44 may include a first electrode 42 connected to the first conductive region 20 and a second electrode 44 connected to the second conductive region 30. Also, the solar cell 150 may further include first and second passivation layers 22 and 32, an anti-reflection layer 24, or the like.

The semiconductor substrate 160 may be formed of a crystalline semiconductor of a single material (e.g., Group 4 element) (e.g., single-crystalline or polycrystalline semiconductor of a single material, as an example, single-crystalline or polycrystalline silicon, particularly, single-crystalline silicon). The solar cell 150 based on the semiconductor substrate 160 having a high degree of crystallinity and having few defects is excellent in electrical property.

A protruded or indented portion, an uneven portion, or an anti-reflection structure may be formed at a front surface and/or a back surface of the semiconductor substrate 160 by a texturing process. The protruded or indented portion, the uneven portion, or the anti-reflection structure may have a pyramid shape formed of an outer surface formed along a specific crystal plane (e.g., (111) plane) of the semiconductor substrate 160 and having an irregular size. When a surface roughness of the semiconductor substrate 160 is increased due to the protruded or indented portion, the uneven portion, or the anti-reflection structure, reflectance of light incident into the semiconductor substrate 160 can be reduced. However, embodiments of the invention are not limited thereto.

The semiconductor substrate 160 may include a base region 110 having a first or second conductivity type. The base region 110 includes a first or second conductivity type dopant with a relatively low doping concentration lower than a doping concentration of the first or second conductive region 20 or 30. As an example, the base region 110 may have a second conductivity type.

In one example, the first conductive region 20 may form an emitter region that forms a pn junction with the base region 10. The second conductive region 30 may form a back surface field region that forms a back electric field for preventing recombination. In this instance, the first and second conductive regions 20 and 30 may be formed entirely on the front surface and the back surface of the semiconductor substrate 160, respectively. Accordingly, the first and second conductive regions 20 and 30 may be formed with a sufficient area without additional patterning. However, embodiments of the invention are not limited thereto.

In the embodiment, the base region 10 and the conductive regions 20 and 30 constituting the semiconductor substrate 160 have a crystal structure of the semiconductor substrate 160 and have different conductivity types, doping concentrations, or so on. That is, it is exemplified that the conductive regions 20 and 30 are doped regions constituting a part of the semiconductor substrate 160. However, embodiments are not limited thereto. Therefore, at least one of the first conductive region 20 and the second conductive region 30 may be formed of an amorphous, microcrystalline, or polycrystalline semiconductor layer or the like, which is formed on the semiconductor substrate 160 as a separate layer. Other variations are possible.

The first conductivity type dopant included in the first conductive region 20 may be an n-type or a p-type dopant and the second conductivity type dopant included in the base region 10 and the second conductive region 30 may be a p-type or an n-type dopant. As the p-type dopant, Group III element such as boron (B), aluminum (Al), gallium (Ga), indium (In), or so on may be used. As the n-type dopant, Group V element such as phosphorus (P), arsenic (As), bismuth (Bi), antimony (Sb), or so on may be used. The second conductivity type dopant in the base region 10 and the second conductivity type dopant in the second conductive region 30 may be formed of the same material or different materials.

For example, the first conductive region 20 may have a p-type, and the base region 10 and the second conductive region 30 may have an n-type. Then, holes having a slower moving speed than electrons move to a front surface of the semiconductor substrate 160, not a back surface of the semiconductor substrate 160, thereby improving conversion efficiency. However, embodiments are not limited thereto, and an embodiment opposite to the above is also possible.

An insulating layer such as first and second passivation layers 22 and 32 for passivating defects in the conductive regions 20 and 30, an anti-reflection layer 24 for preventing reflection of light, or so on may be formed on surfaces of the semiconductor substrate 160. Such an insulating layer may be formed of an undoped insulating layer which does not include a dopant. The first and second passivation layers 22 and 32 and the anti-reflection layer 24 may be formed substantially on an entire surface of the semiconductor substrate 160 except for a portion corresponding to the first or second electrode 42 or 44 (more particularly, a portion where a first or second opening 102 or 104 is formed).

For example, the passivation layers 22 and 32 or the anti-reflection layer 24 may be formed of a single layer or a multilayer in which two or more layers are combined. The single layer or the multilayer may include at least one of a silicon nitride layer, a silicon nitride layer containing hydrogen, a silicon oxide layer, a silicon oxynitride layer, an aluminum oxide layer, $MgF_2$, ZnS, $TiO_2$, and $CeO_2$. For example, the first or second passivation layer 22 or 32 may include a silicon oxide layer, a silicon nitride layer, or the like having a fixed positive charge when the conductive region 20 or 30 have an n-type, or the first or second passivation layer 22 or 32 may include an aluminum oxide layer having a fixed negative charge, or the like when the conductive region 20 or 30 have a p-type. In one example, the anti-reflective layer 24 may include silicon nitride. In addition, a material, a lamination structure, and the like of the insulating layer may be variously modified.

The first electrode 42 is electrically connected to the first conductive region 20 through the first opening 102 and the second electrode 44 is electrically connected to the second conductive region 30 through the second opening 104. For example, the first electrode 42 may be in contact with the first conductive region 20 and the second electrode 44 may be in contact with the second conductive region 30. The first and second electrodes 42 and 44 may be formed of any of various materials (for example, a metal material) and may have any of various shapes. An example of shapes of the first and second electrodes 42 and 44 will be described later.

As described above, in the embodiment, the first and second electrodes 42 and 44 of the solar cell 150 have a certain pattern, and the solar cell 150 receives light from the front surface and the back surface of the semiconductor substrate 160 to have a bi-facial structure. Accordingly, an amount of light used in the solar cell 150 can be increased to contribute to an efficiency improvement of the solar cell 150.

However, embodiments of the invention are not limited thereto, and the second electrode 44 may be formed entirely on the back surface of the semiconductor substrate 160. The first and second conductive regions 20 and 30 and the first and second electrodes 42 and 44 may be positioned together on one surface (e.g., a back surface) of the semiconductor substrate 160. Also, at least one of the first and second conductive regions 20 and 30 may be formed on both surfaces of the semiconductor substrate 160. That is, the solar cell 150 described ill the above is merely one example, but embodiments of the invention are not limited thereto.

The solar cell 150 is electrically connected to the neighboring solar cell 150 by an interconnecting members 142 positioned on (e.g., in contact with) the first electrode 42 or the second electrode 44. This will be described in more detail with reference to FIG. 4 together with FIGS. 1 to 3.

Figure 4:
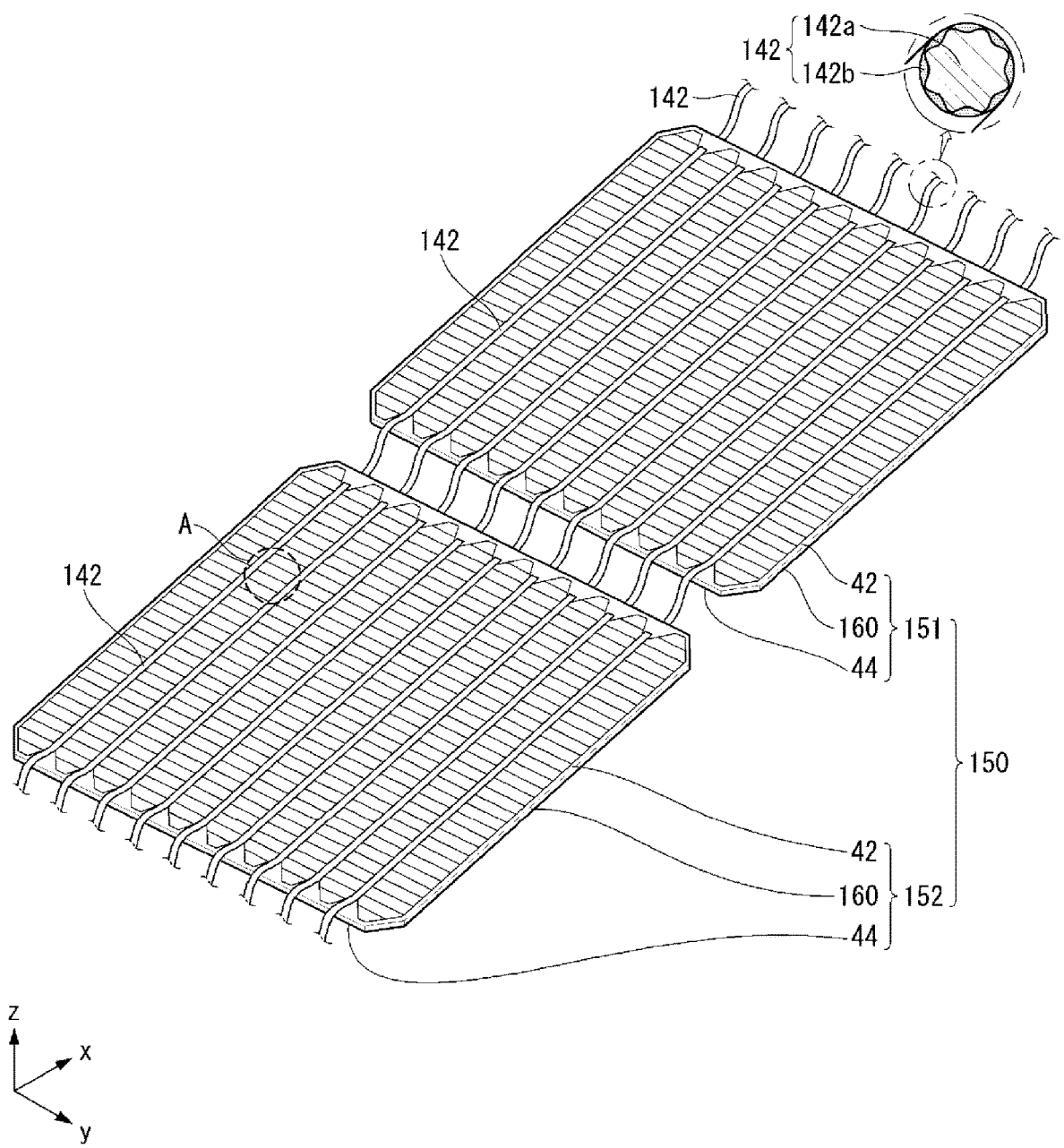
FIG. 4 is a perspective view schematically showing a first solar cell and a second solar cell connected by the interconnecting members, which are included in the solar cell panel shown in FIG. 1.

FIG. 4 is a perspective view schematically showing a first solar cell 151 and a second solar cell 152 connected by interconnecting members 142, which are included in the solar cell panel 100 shown in FIG. 1. A semiconductor substrate 160 and electrodes 42 and 44 of the first and second solar cells 151 and 152 are schematically shown only in FIG. 4 for simplicity and clarity.

As shown in FIG. 4, an interconnecting member 142 electrically connects a first electrode 42 on a front surface of a first solar cell 151 and a second electrode 44 on a back surface of a second solar cell 152 positioned at one side (a left and lower side in FIG. 4) of the first solar cell 151. Another interconnecting member 142 electrically connects the second electrode 44 on the back surface of the first solar cell 151 and the first electrode 42 on the front surface of another solar cell, which will be positioned at the other side (a right and upper side in FIG. 4) of the first solar cell 151. Still another interconnecting member 142 electrically connects the first electrode 42 on the front surface of the second solar cell 152 and the second electrode 44 on the back surface of still another solar cell, which will be positioned at the one side (a left and lower side in FIG. 4) of the second solar cell 152. Accordingly, the plurality of solar cells 150 can be connected to each other by the interconnecting members 142. The description of the interconnecting member 142 may be applied to the interconnecting members 142 that connect two adjacent solar cells 150 to each other.

In this instance, a plurality of interconnecting members 142 are provided on one surface of each solar cell 150 and the plurality of interconnecting members 142 extend in a direction (an x-axis direction of the drawings, a direction crossing a finger lines 42a, or a direction parallel to a bus bar line 42b), and thus, an electrical connection property of two adjacent solar cells 150 can be enhanced. The specific structure of the interconnecting member 142 will be described later in more detail with reference to FIGS. 6 to 10.

Figure 5:
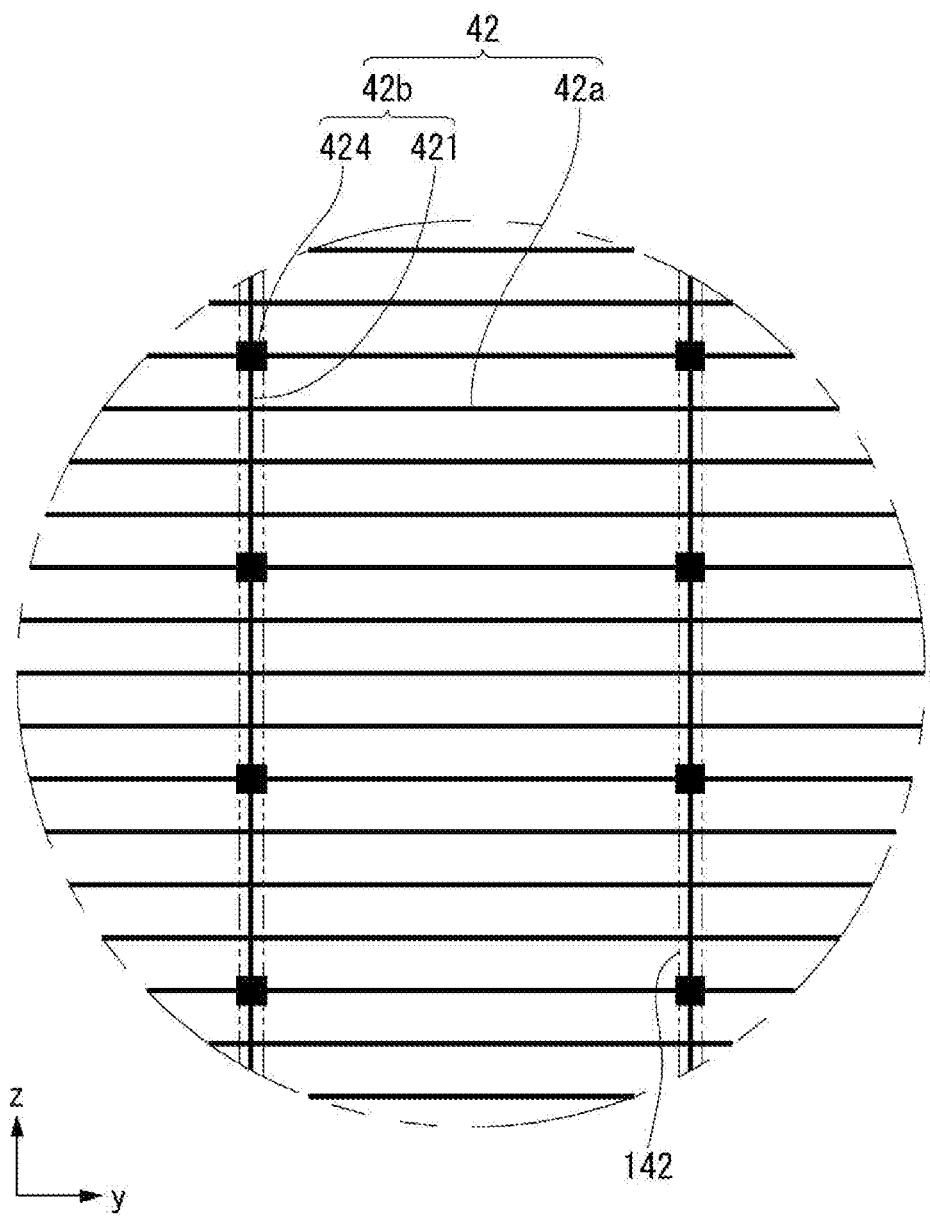
FIG. 5 is an enlarged partial plan view of portion A in FIG. 4.

An example of the electrodes 42 and 44 of the solar cell 150 where the interconnecting members 142 may be attached, according to the embodiment of the invention, will be described in more detail with reference to FIG. 5 together with FIGS. 1 to 4. Hereinafter, an illustration and a description of the electrodes 42 and 44 will be given in conjunction with the first electrode 42 with reference to FIG. 5 first, and then, the second electrode 44 will be described. FIG. 5 is an enlarged partial plan view of portion A in FIG. 4.

Referring to FIGS. 1 to 5, in the embodiment, the first electrode 42 includes a plurality of finger lines (finger electrodes) 42a extending in a first direction (a y-direction in the drawing) to be parallel to each other. The first electrode 42 may further include a bus bar line (a bus bar, a bus electrode, or a bus bar electrode) 42b extending in a second direction (an x-direction in the drawing) crossing (for example, perpendicular to) the finger line 42a. The interconnecting member 142 may be connected or attached to the bus bar line 42b. Since the bus bar lines 42b may be arranged in an one-to-one correspondence with the interconnecting members 142, the description of a number of the interconnecting members 142 and the like may be directly applied to a number of the bus bar lines 42b and the like.

The bus bar line 42b may include a line portion 421 and a pad portion 424. The line portion 42a may extend in a direction in which the interconnecting member 142 extends and have a relatively narrow width. The pad portion 424 may have a width wider than the line portion 421, and may be a portion where the interconnect ting member 142 substantially connected. Optical loss can be minimized by the line portion 421, and an adhesion force with the interconnecting member 142 can be increased and contact resistance can be decreased by the pad portion 424. The line portion 421 may provide a path through which carriers bypass when some finger lines 42a are broken or damaged.

A width of the pad portion 424 in the first direction may be greater than a width of the line portion 421 in the first direction and a width of the finger line 42a in the second direction. A length of the pad portion 424 in the second direction may be greater than a width of the line portion 421 in the first direction and a width of the finger line 42a in the second direction. A width of the line portion 421 may be the same as or smaller than a width of the interconnecting member 142 and a width of the pad portion 424 may be the same as or larger than a width of the interconnecting member 142. As described above, when the pad portion 424 has a sufficient width, an adhesion force with the interconnecting member 142 can be improved and contact resistance can be reduced. A width of the interconnecting member 142 may be smaller than a pitch of the finger lines 42a and may be greater than a width of the finger lines 42a. However, embodiments are not limited thereto and various modifications are possible.

In one bus bar line 42b, 6 to 24 (for example, 12 to 22) of pad portions 424 may be arranged at regular intervals. In one example, the pad portion 424 may be positioned one by one for every two to ten finger lines 42a. However, a number, an arrangement, and the like of the pad portions 424 may be variously modified. For example, a number and a density of the pad portions 424 may be increased at a portion where a large force acts.

In the above description, the first electrode 42 is mainly described with reference to FIG. 5. The second electrode 44 may include a finger line and a bus bar line corresponding to the finger line 42a and the bus bar line 42b of the first electrode 42, respectively. The description of the first electrode 42 may be applied to the second electrode 44 as it is. In this instance, a width or a number of the finger lines 42a, and the line portion 421 and the pad portions 442 of the bus bar line 42b may be the same or may be different in the first electrode 42 and the second electrode 44.

In the embodiment, the interconnecting member 142 has a certain shape to achieve various effects, which will be described with reference to FIGS. 6 to 10, along with FIGS. 1 to 5.

Figure 6:
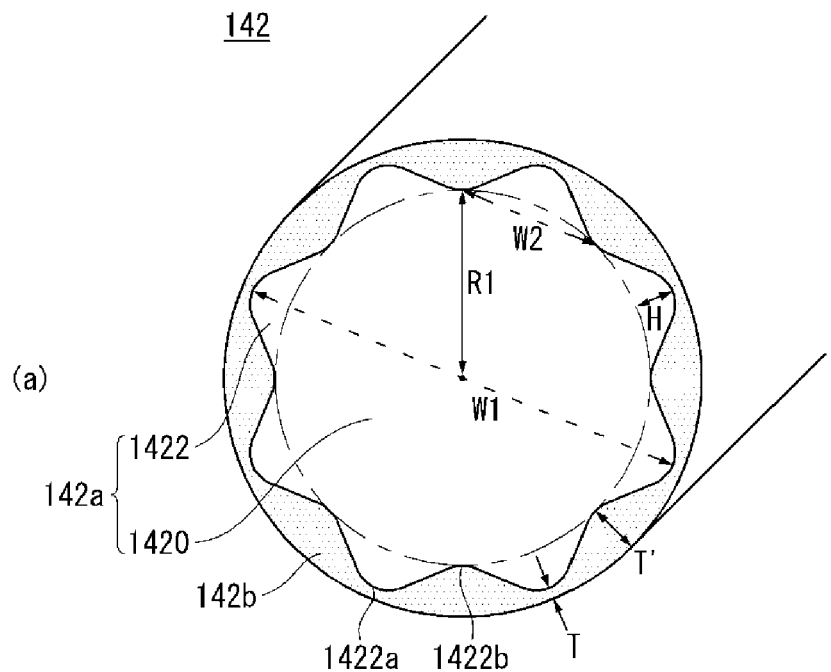
FIG. 6 is a perspective view showing shapes of an interconnecting member included in a solar cell panel according to an embodiment of the invention before and after an attaching process.
Figure 6:
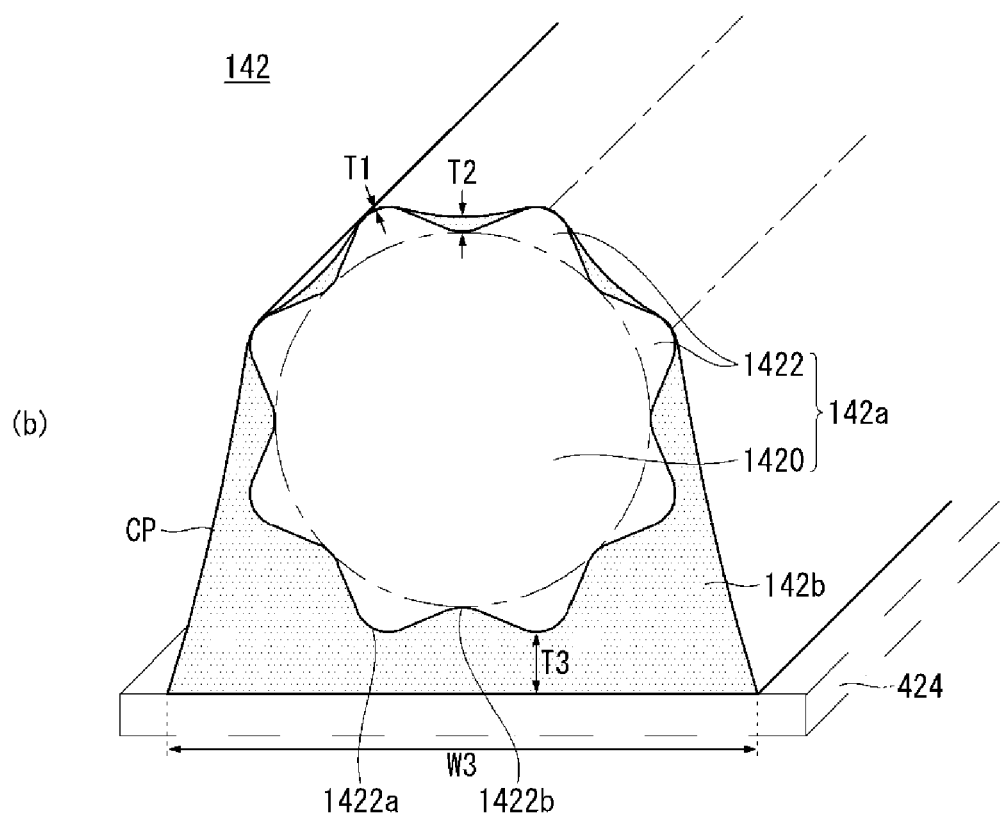
Figure 7:
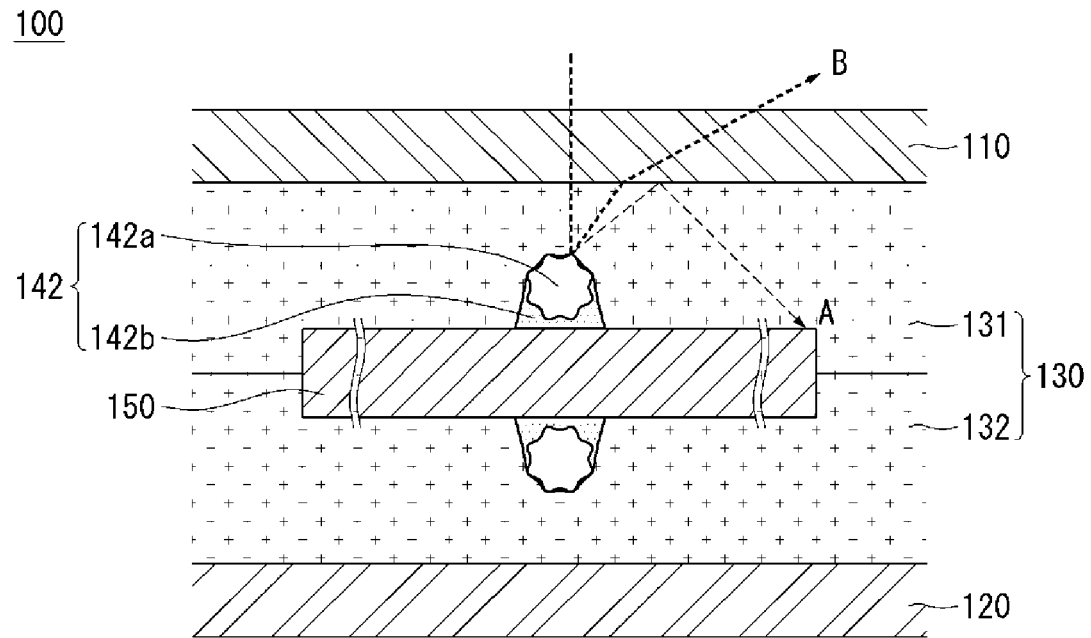
FIG. 7 is a schematic view showing a light reflection by the interconnecting member shown in FIG. 6.

FIG. 6 is a perspective view showing shapes of an interconnecting member 142 included in the solar cell panel 100 according to the embodiment of the invention before and after an attaching process. FIG. 7 is a schematic view showing a light reflection by the interconnecting member 142 shown in FIG. 6. Particularly, in the embodiment, shapes of a solder layer 142b of the interconnecting member 142 before and after the attaching process may be different. Thus, a structure of the interconnecting member 142 before an attaching process will be described in detail with reference to FIG. 6(a) and then a structure of the interconnecting member 142 (particularly, a structure of the solder layer 142b) connected to a solar cell 150 after an attaching process will be described in detail with reference to FIG. 6(b). In this instance, boundaries of a first electrode 42 (particularly, a pad portion 424) to which the interconnecting member 142 is attached are also shown in FIG. 6(b) for reference.

Referring to FIG. 6(a), in the embodiment, an interconnecting member 142 is formed of a wire having a width smaller than that of a ribbon having a relatively wide width (for example, 1 mm to 2 mm). For example, a maximum width of the interconnecting member 142 may be 1 mm or less. In this instance, the maximum width of the interconnecting member 142 may mean the largest width among widths passing a center of the interconnecting member 142. When the interconnecting member 142 has the above maximum width, resistance of the interconnecting member 142 can be low and a light loss can be minimized, and the interconnecting member 142 can be stably attached to the solar cell 150.

A number of the interconnecting members 142 may be greater than a number of the conventional ribbons (for example, 2 to 5) with respect to one surface of each solar cell 150. Then, a movement distance of carriers can be reduced by a large number of the interconnecting members 142 while minimizing an optical loss and a material cost by the interconnecting member 142 due to a small width. An efficiency of the solar cell 150 and an output of the solar cell panel 100 can be improved, and a material cost due to the interconnecting member 142 can be reduced and thus a productivity of the solar cell panel 100 can be improved.

Considering that an attaching process of the interconnecting member 142 to the solar cell 150 may be complicated when the interconnecting members 142 having a small width is used in a large number, the interconnecting member 142 may include a core layer 142a and a solder layer 142b formed on a surface of the core layer 142a. Then, a large number of the interconnecting members 142 can be effectively adhered by a step of applying heat and pressure in the state that the interconnecting members 142 are placed on the solar cell 150.

The interconnecting member 142 or the core layer 142a, which is included in the interconnecting member 142 and constitutes most of the interconnecting member 142, may include a rounded portion. That is, at least a part of a cross-section of the interconnecting member 142 or the core layer 142a may include a circular shape, a part of a circular shape, an elliptical shape, a part of an elliptical shape, or a part formed of a curved portion or a curved line.

Since the interconnecting member 142 has a structure where the solder layer 142b is formed on an entire surface (an entire circumferential surface or an entire side surface) of the core layer 142a, the interconnecting members 142 can be attached by positioning the interconnecting members 142 directly on the solar cell 150 without a process of additionally applying a solder material, or the like. Thus, an attaching process of the interconnecting member 142 can be simplified. In addition, reflection or scattered reflection of light can be induced at the rounded portion of the interconnecting member 142, and thus, the reflected light can be re-incident to the solar cell 150 and reused. Accordingly, an amount of light incident to the solar cell 150 can be increased, and an efficiency of the solar cell 150 and an output of the solar cell panel 100 can be improved.

In this instance, a number of the interconnecting members 142 is 6 to 33 (for example, 8 to 33, for example, 10 to 33, in particular 10 to 15) with respect to one surface of the solar cell 150. The interconnecting members 142 may be positioned at a uniform spacing or interval from each other. The plurality of interconnecting members 142 in each solar cell 150 may have a symmetrical shape when viewed in a longitudinal direction of the finger lines 42a. Thus, a sufficient number of the interconnecting members 142 can be provided, and a movement distance of carriers can be minimized.

In the embodiment, the interconnecting member 142 may include a core layer 142a formed of a metal, and a solder layer 142b formed on a surface of the core layer 142a and including a solder material to enable soldering with electrodes 42 and 44. That is, the solder layer 142b can serve as a kind of adhesive layer. For example, the core layer 142a may include Ni, Cu, Ag, Al or the like as a main material (for example, a material included with 50 wt % or more, or more specifically, a material included with 90 wt % or more). The solder layer 142b may include a solder material such as Pb, Sn, SnIn, SnBi, SnPb, SnPbAg, SnCuAg, or SnCu as a main material. However, embodiments of the invention are not limited thereto, and the core layer 142a and the solder layer 142b may include any of various materials.

In this instance, the core layer 142a has a protruding portion 1422. The protruding end 1422a includes a peak portion or a protruding end 1422a extending in a longitudinal direction of the core layer 142a, and a reflection surface formed of a rounded portion at both sides of the protruding end 1422a so that a width of the protruding portion 1422 increases from the protruding end 1422a of the core layer 142a to a center of the core layer 142a. That is, in the embodiment, the core layer 142a includes the protruding portion 1422 having a rounded portion or a curved surface as a reflection surface. A cross-section of the core layer 142a has a central portion 1420 and a plurality of protruding portions 1422. The protruding portion 1422 has a maximum height H smaller than a maximum width or a maximum diameter of the central portion 1420. The plurality of protruding portions 1422 are disposed at an outer side of the central portion 1420 and forms an integral structure with the central portion 1420. In this instance, the term of "the integral structure" may mean a structure having a single body which is manufactured by one process using one material, has the same material, and does not have a separate part distinguished from each other without a difference in material, property, or so on. In this instance, the central portion 1420 may have a rounded shape. In this instance, the term of "the rounded shape" may include a circular shape having substantially the same diameter crossing a center, an elliptical shape, or the like. For example, in the embodiment, the central portion 1420 has a circular shape. Thus, the maximum width or the maximum diameter of the central portion 1420 has a first curvature radius R1.

For reference, in FIG. 6(a), a boundary line between the central portion 1420 and the plurality of protruding portions 1422 is indicated by a one-point ruled line. However, as described above, the central portion 1420 and the plurality of protruding portions 1422 are formed of the integral structure, and thus, there is no separate boundary line in practice.

When the core layer 142a is formed of a single body as described above, a manufacturing process is easy and simple, a manufacturing cost can be reduced, and a structural stability is excellent. For example, the core layer 142a may be easily manufactured by a drawing process or the like. On the contrary, if a core layer is formed of a plurality of wires or the like, a manufacturing process is complicated and a manufacturing cost is increased, and problems that a plurality of wires are separated and divided from each other may be induced during a movement of an interconnecting member, during an attaching process of an interconnecting member, after the attaching process of the interconnecting member, or so on.

Unlike the embodiment, if a protruding portion 1422 is not provided, even if reflection occurs due to a core layer, it may be difficult to contribute to perform photoelectric conversion because light is reflected at an angle that may be not total-reflected at the first or second cover member 110 or 120 as shown by an arrow B in FIG. 7. On the other hand, in the embodiment, as shown by an arrow A in FIG. 7, light reflection occurs at a plurality of protruding portions 1422 or a depressed portion (a recessed portion, a dented portion, a recess end, a dented end, or so on) 1422b located on an outer surface of the core layer 142a, and the reflected light can be re-reflected (for example, total-reflected) by the first or second cover member 110 or 120 and can be incident again to the solar cell 150 and reused. Thus, an amount of light involved in photoelectric conversion can be maximized.

In this instance, the plurality of protruding portions 1422 may be regularly positioned at the same distance when viewed in a cross-section of each interconnecting member 142 perpendicular to a longitudinal direction. A reflection surface positioned with respect to the protruding end 1422a may have a symmetrical shape. A depressed portion 1422b or a valley may be provided between the plurality of protruding portions 1422. In this instance, the plurality of protruding portions 1422 may have substantially the same size (e.g., the substantially the same maximum width W2 of a lower portion and the substantially same maximum height H). The term of "the substantially same size" may mean that an error is within 10%. The maximum width W2 of the lower portion of the protruding portion 1422 may mean a maximum linear distance between two adjacent depressed portions 1422b or a maximum linear distance between two adjacent protruding portions 1422 (e.g., a distance between two adjacent protruding portions 1422). For example, the protruding portions 1422 may be four to twelve (for example, five to eight) when viewed in a cross-section of each interconnecting member 142 perpendicular to a longitudinal direction. In particular, if eight protruding portions 1422 are provided, reflectance by the protruding portions 1422 can be maximized.

The arrangement and the number are intended to improve an adhesion property with the pad portion 424 and to allow light to be reflected by the interconnecting member 142 at an angle that the light can be re-incident to the solar cell 150. However, embodiments of the invention are not limited thereto.

In this instance, the protruding portion 1422 of the core layer 142a may have a rounded portion. As an example, as shown in FIG. 6(a), a protruding end (a peak portion) 1422a of the protruding portion 1422 and the depressed portion 1422b between the plurality of protruding portions 1422 may have a rounded shape (a part of a circular shape, a part of an elliptical shape, a curved line, etc.). That is, the protruding portion 1422 may have a peak portion of a curved surface, or the depressed portion or valley between the protruding portions 1422 may have a valley of a curved surface. In this instance, the protruding end 1422a and the depressed portion 1422b may have curvatures of opposite directions to each other. That is, the protruding end 1442a has a convex curvature outward and the depressed portion 1422b may have a concave curvature outward. In this instance, the protruding end 1422a and the depressed portion 1422b may be connected in a straight line when viewed in a cross-section or may be connected by a flat surface.

Figure 8:
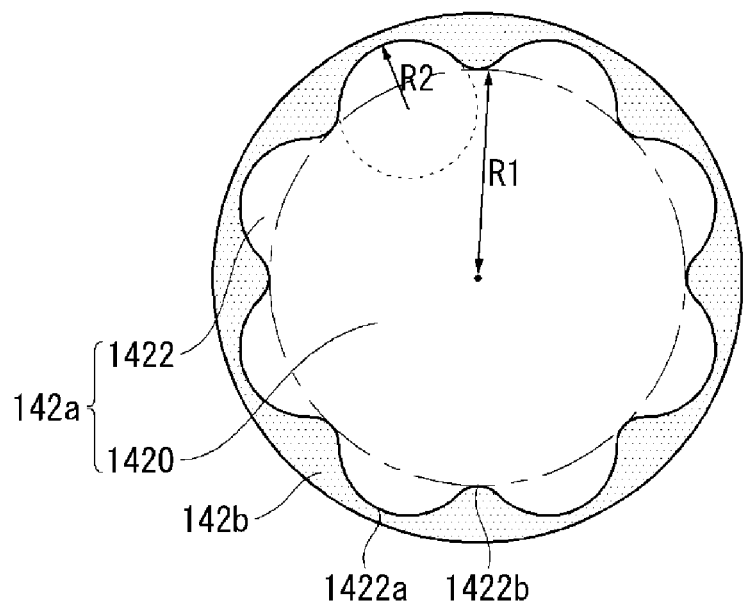
FIG. 8 is a cross-sectional view showing a shape of an interconnecting member included in a solar cell panel according to a modified embodiment of the invention before an attaching process.
Figure 9:
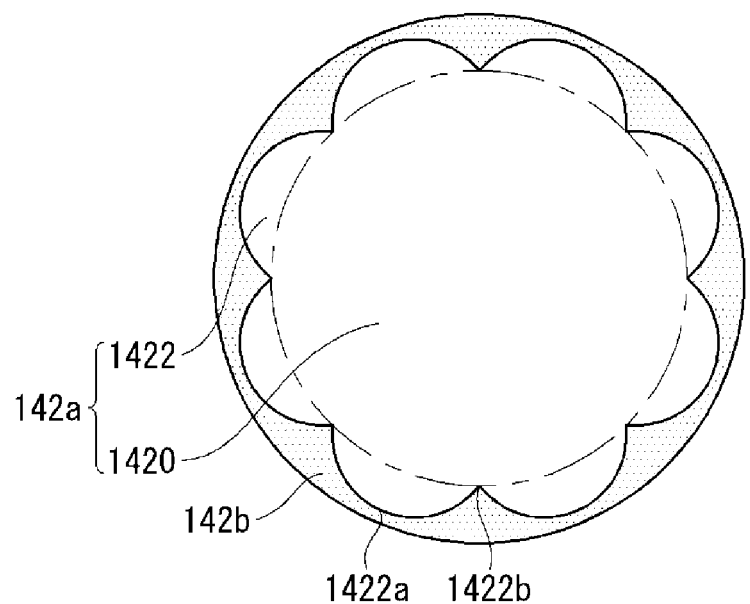
FIG. 9 is a cross-sectional view showing a shape of an interconnecting member included in a solar cell panel according to another modified embodiment of the invention before an attaching process.

Alternatively, as a modified embodiment, as shown in FIG. 8, the protruding portion 1422 may have a rounded portion (e.g., a part of a circular shape) having a second curvature radius R2 smaller than the first curvature radius R1. In this instance, the protruding portion 1422 and the depressed portion 1422b may have curvatures of opposite directions to each other. That is, the protruding portion 1422 has a convex curvature outward as a whole, and the depressed portion 1422b may have a concave curvature outward. Alternatively, as another modified embodiment, as shown in FIG. 9, a protruding portion 1422 may have a rounded portion (e.g., a part of a circular shape) having a second curvature radius R2 smaller than a first curvature radius R1, and a depressed portion 1422b may does not have a curvature of a direction opposite to a curvature of the protruding portion 14422.

When the core layer 142a has the above structure, a defect rate of the core layer 142a having a plurality of protruding portions 1422 can be reduced to improve a productivity, and electrodes 42 and 44 can be prevented from being damaged and a contact area between the interconnecting member 142 and the electrodes 42 and 44 can be maximized by the protruding portions 1422 having a rounded shape. On the other hand, a protruding portion having a sharp protruding end is difficult to produce, resulting in high defect rates or very low productivity. In addition, the sharp protruding end may dig into an electrode where an interconnecting member is attached, and thus, an electrode may be undesirably damaged or a contact area between the interconnecting member and the electrode may be reduced compared with the interconnecting member not having a protruding portion.

Referring to FIGS. 1 to 6 again, in the embodiment, a maximum height H of the protruding portion 1422 may be larger than a thickness T of the solder layer 142b. The maximum height H of the protruding portion 1422 is the largest heights among heights from the central portion 1420. For example, the maximum height H of the protruding portion 1422 may refer to a distance between the central portion 1420 and the protruding end 1422a in a normal direction or a straight line passing through a center of the core layer 142 and extending in a radial direction. The thickness T of the solder layer 142b may mean a minimum thickness of the solder layer 142b formed according to a design. For example, the thickness T of the solder layer 142b may refer to a thickness of the solder layer 142b located on the protruding end 1422a in a normal direction or a straight line passing through a center of the core layer 142 and extending in a radial direction When the maximum height H of the protruding portion 1422 of the core layer 142a including the plurality of protruding portions 1422 is larger than the thickness T of the solder layer 142b, a volume or an surface area of the solder layer 142b located on an outer surface of the solder layer 142b can be greatly increased. Then, the solder layer 142a of a large surface area or a large amount can increase an adhesion property of the core layer 142a having a plurality of protruding portions 1422 and the pad portion 424 and reduce the resistance. In addition, it is possible to effectively prevent the solder layer 142b from flowing out at a portion beside the pad portion 424 and adversely affecting the solar cell 150, which may be induced when the solder layer 142b is included in an excessive amount. Thus, an output and a reliability of the solar cell panel 100 can be improved.

In one example, a ratio (T/H) of the thickness T of the solder layer 142b to the maximum height H of the protruding portion 1422 may be 0.001 to 0.3. Alternatively, the maximum height H of the protruding portion 1422 may be 60 to 120 µm, and the thickness of the solder layer 142*b* may be 1 to 10 µm (for example, 2 to 8 µm). Within this range, an amount of the solder layer 142*b* does not significantly increase while effectively controlling a volume or a surface area of the solder layer 142*b* by the plurality of protruding portions 1422, and thus, the solder layer 142*b* can be stably positioned between the plurality of protruding portions 1422.

The solder layer 142*b* formed on an entire outer surface of the core layer 142*a* may be positioned on the protruding portions 1422 while filling a space between the protruding portions 1422. In this instance, a thickness T of the solder layer 142*b* on the depressed portion 1422*b* of the protruding portion 1422 is greater than a thickness T' of the solder layer 142*b* on the protruding end 1422*a* of the protruding portion 1422. Thereby, the solder layer 142*b* can be positioned between the protruding portions 1422 with a sufficient amount, and thus, the core layer 142*a* can be stably attached to the pad portion 424.

The solder layer 142*b* may be formed on the core layer 142*a* by any of various methods. For example, a solder material constituting the solder layer 142*b* may be formed on an outer surface of the core layer 142*a* and dried to have a predetermined shape to form the solder layer 142*b* on the core layer 142*a*. For example, the core layer 142*a* may be passed through a bath containing a solder material constituting the solder layer 142*b* so that the solder layer 142*b* is entirely located on an outer surface of the core layer 142*a*, and then, the core layer 142*a* coated with the solder layer 142*b* may be dried while passing through a mold having a predetermined shape or may be passed through a mold and then dried so that the outer surface of the solder layer 142*b* has a predetermined shape. An amount of the solder material can be effectively controlled by using the mold as in the above.

As an example, an outer surface of the solder layer 142*b* may have a circular shape in a cross-section perpendicular to a longitudinal direction of the interconnecting member 142. By using such a circular mold, an extra solder material can be stably removed, and thus, the solder layer 142*b* can be stably formed and productivity can be improved. On the other hand, if the mold has a curved portion or a bent portion, a sweep phenomenon may occur when the solder layer 142*b* may moves inside the mold and thus the solder layer 142*b* may not be formed at some portions. Then, the interconnecting member 142 becomes defective, and a productivity may be lowered.

Figure 10:
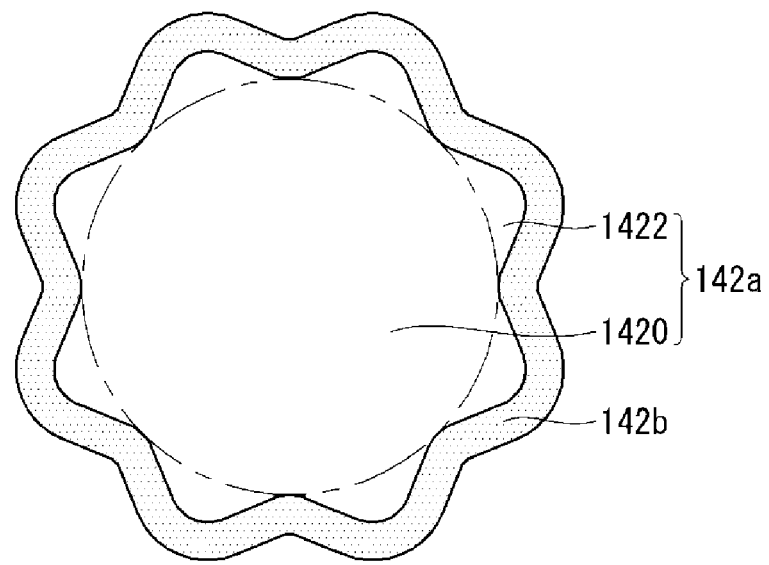
FIG. 10 is a cross-sectional view showing a shape of an interconnecting member included in a solar cell panel according to yet another modified embodiment of the invention before an attaching process.

However, embodiments of the invention are not limited thereto. Therefore, as shown in FIG. 10, a second surface of the solder layer 142*b* located on the depressed portions 1422*b* of the protruding portion 1422 may be closer to a center of the core layer 142*a* than a first surface of the solder layer 142*b* located on the protruding end 1422*a* of the protruding portion 1422. The solder layer 142*b* may have a curvy shape or a curved shape to correspond to the plurality of protruding portions 1422. In one example, the solder layer 142*b* may have a uniform thickness at an entire portion. Alternatively, a thickness of the solder layer 142*b* located on the depressed portion 1422*b* of the protruding portion 1422 may be greater than a thickness of the solder layer 142*b* located on the protruding end 1422*a* of the protruding portion 1422. The solder layer 142*b* may be formed by controlling process conditions and the like while using a mold corresponding to a shape of the solder layer 142*b*. Various other modifications are possible.

Referring to FIGS. 1 to 6 again, in the embodiment, the maximum height H of the protruding portion 1422 may be smaller than the maximum width W2 of the lower portion of the protruding portion 1422 adjacent to the central portion 1420. When the maximum width W2 of the lower portion of the protruding portion 1422 is larger than the maximum height H of the protruding portion 1422, a structural stability of the protruding portion 1422 can be enhanced and the solder layer 142*a* formed on the plurality of protruding portions 1422 can be uniformly and stably formed on an outer surface of the core layer 142*a*. In particular, it effectively prevents the solder layer 142*a* from being concentrated at one side by a surface tension when the solder layer 142*a* is formed. On the other hand, if the maximum height F1 of the protruding portions 1422 is too large and/or the maximum width W2 of the lower portion of the protruding portions 1422 is too small, the solder layer 142*b* may not fill the space between the protruding portions 1422 an thus a problem that there is a portion where the solder layer 142*b* is not positioned may occur. For example, if a cross-section of the interconnecting member is a circular shape, a solder layer may be concentrated to one side due to a surface tension when the solder layer is formed, and thus, the solder layer may not be uniformly formed.

As an example, a ratio (H/W2) of the maximum height H of the protruding portion 1422 to the maximum width W2 of the lower portion of the protruding portion 1422 adjacent to the central portion 1420 is 0.05 to 0.7. If the ratio is less than 0.05, the maximum height H of the protruding portion 1422 may be not sufficient or a number of the protruding portions 1422 may be not sufficient and thus an effect of the protruding portion 1422 may not be sufficient. If the ratio exceeds 0.7, the solder layer 142*b* may not be sufficiently filled between the protruding portions 1422 due to a surface tension or the like. In one example, the ratio (H/W2) of the maximum height H of the protruding portion 1422 to the maximum width W2 of the lower portion of the protruding portion 1422 adjacent to the central portion 1420 may be 0.05 to 0.5 (more particularly, 0.1 to 0.4). The effect of the protruding portion 1422 may be maximized within this range. However, embodiments of the invention are not limited thereto.

The maximum height H of the protruding portion 1422 may be smaller than a diameter W1 of the core layer 142*a*. For example, a ratio (H/W1) of the maximum height H of the protruding portion 1422 to the diameter W1 of the core layer 142*a* may be 0.05 to 0.4. The diameter W1 of the core layer 142*a* may mean the largest diameter passing through a center of the core layer 142*a*. For example, the diameter W1 of the core layer 142*a* may a sum of a width of the central portion 1420 or the first curvature radius R1 and a height of the protruding portion 1422 located on one side or both sides thereof. If the above ratio (H/W1) is less than 0.1 (for example, less than 0.15), the effect of the protruding portion 1422 may not be sufficient. If the above ratio H/W1 exceeds 0.4, the solder layer 142*b* may not be sufficiently filled between the protruding portions 1422 due to a surface tension or the like. Alternatively, the diameter W1 of the core layer 142*a* may be 200 to 600 µm (for example, 350 to 550 µm, for example, 350 to 500 µm) and the maximum height H of the protruding portion 1422 is 60 to 120 µm. This range is limited so that the solder layer 142*b* is sufficiently filled between the protruding portions 1422 while maximizing, the effect of the protruding portions 1422. However, embodiments of the invention are not limited thereto.

On the other hand, when the interconnecting member 142 is attached to the solar cell 150 by a tabbing process, a shape of the solder layer 142 may be changed at a portion of the interconnecting member 142 attached to or connected to the solar cell 150 as shown in FIG. 6(b). The shape of the solder layer 142b described below is a portion of the interconnecting member 142 attached to or connected to the solar cell 150.

More specifically, the interconnecting member 142 is attached to at least the pad portion 424 by the solder layer 142b. In this instance, the solder layer 142b of each interconnecting member 142 is separately and individually positioned with other interconnecting member 142 or other solder layer 142b. When the interconnecting member 142 is attached to the solar cell 150 by a tabbing process, each solder layer 142b entirely flows toward the first or second electrode 42 or 44 (more particularly, the pad portion 424) during the tabbing process. Then, a width of the solder layer 142b gradually increases toward the pad portion 424 at a portion adjacent to each pad portion 424 or at a portion located between the pad portion 424 and the core layer 142a. As an example, a portion of the solder layer 142b adjacent to the pad portion 424 may have a width W3 that is equal to or greater than the diameter W1 of the core layer 142a. In this instance, the width W3 of the solder layer 142b may be equal to or less than a width of the pad portion 424.

More specifically, a portion of the solder layer 142b on an upper portion of the core layer 142a has a protruded shape toward an outside of the solar cell 150 according to a shape of the core layer 142b (in particular, according to a shape of the plurality of protruding portions 1422), while another portion of the solder layer 142b positioned at a lower portion of the core layer 142a or adjacent to the pad portion 424 includes a portion having a concave shape toward an outside of the solar cell 150. As a result, an inflection point CP at which a curvature changes is located at a side of the solder layer 142b. It can be seen from this shape of the solder layer 142b that the interconnecting members 142 are individually attached and fixed by the solder layer 142b in a state where the interconnecting member 142 is not inserted or covered in a separate layer, film or the like. The solar cell 150 and the interconnecting member 142 can be connected by a simple structure and a process by fixing the interconnecting member 142 through using the solder layer 142b without using a separate layer, film, or the like. Particularly, the interconnecting member 142 having a narrow width and a rounded shape as in the embodiment can be attached without using a separate layer, film, or the like (for example, a conductive adhesive film including a resin and a conductive material), a process cost and a process time of the interconnecting member 142 can be minimized.

In this instance, the thickness T3 of the solder layer 142b located between the pad portion 424 and the core layer 142a at a portion of the interconnecting member 142 attached to the solar cell 150 may be larger than the thickness T1 of the solder layer 142b located on the protruding end 1422a of the protruding portion 1422, which is opposite to the portion of the interconnecting member 142 attached to the solar cell 150 (that is, which is positioned toward at an outside) and may be larger than the thickness T2 of the solder layer 142b located on the depressed portion 1422b between the plurality of protruding portions 1422. This is because the solder layer 142b flows down in a direction of the pad portion 424 in the tabbing process. It is exemplified that the thickness T2 of the solder layer 142b located on the depressed portion 1422b between the plurality of protruding portions 1422 is greater than the thickness T1 of the solder layer 142b located on the protruding end 1422a of the protruding portion 1422, which is positioned toward at an outside in the drawings. However, embodiments of the invention are not limited thereto.

In this instance, at least two of the plurality of protruding portions 1422 may be attached to the pad portion 424 by the solder layer 142b. That is, at least two of the plurality of protruding portions 1422 protrude toward the pad portion 424 so that at least two of the plurality of protruding portions 1422 overlap the pad portion 424 when viewed in a plan view, and the solder layer 142b is positioned between these two protruding portions 1422 and the pad portion 424 so that the core layer 142a can be attached and fixed to the pad portion 424. This is formed by the plurality of protruding portions 1422 of the core layer 142a, and the solder layer 142b located between the protruding portions 1422 can be used as it is to fix the core layer 142a and the pad portion 424. Also, a number and a total area of portions of the core layer 142a attached to the pad portion 424 by the solder layer 142b can be increased. Thus, a fixing stability of the pad portion 424 and the interconnecting member 142 or the core layer 142a can be greatly improved.

On the other hand, even after the tabbing process, a portion of the interconnecting member 142 located between the neighboring solar cells 150 (e.g., at an outside of the solar cell 150) where heat is not applied or relatively little heat is applied may have a shape as shown in FIG. 6(a). Accordingly, description of these portions will be omitted.

According to the embodiment, optical loss can be minimized by scattered reflection or the like using an interconnecting member 142 of a wire shape, and a movement path of carrier can be reduced by increasing a number of interconnecting members 142 and reducing pitches of the interconnecting member 142. In addition, a width or a diameter of the interconnecting member 142 is reduced, and thus, a material cost can be greatly reduced. Thus, an efficiency of the solar cell 150 and an output of the solar cell panel 100 can be improved.

In this instance, a volume or a surface area of the solder layer 142b formed on a surface of the plurality of protruding portions 1422 can be effectively increased by the plurality of protruding portions 1422. For example, when a plurality of protruding portions 1422 are additionally formed while maintaining a diameter of the central portion 1420 as it is as a diameter of the conventional core layer, an outer surface of the core layer 142a increases as much as the plurality of protruding portions 1422 so that a surface area of the solder layer 142b formed along the plurality of protruding portions 422 can be increased. Alternatively, when a size or a diameter of the central portion 1420 is smaller than a diameter of the conventional core layer while maintaining a diameter of the core layer as it is as the diameter of the conventional core layer, the solder layer 142b may be further positioned between the protruding portions 1422, and thus, a volume of the solder layer 142b can be increased.

Thus, an attaching property of the interconnecting member 142 can be improved and the resistance can be reduced. An amount of light reflected by the reflection surface of the plurality of protruding portions 1442 to be re-incident to the solar cell 150 can be increased and thus an amount of light used for photoelectric conversion can be increased. The plurality of protruding portions 1422 may be formed as an integral structure as a part of the core layer 142a so that the core layer 142a may be formed of a single body to improve a structural stability. Thus, an output and a reliability of the solar cell panel 100 can be improved. The effect can be greatly enhanced when the structure is applied to the interconnecting member 142 that may have a small attaching area by a small width and a rounded portion and may have high resistance.

Hereinafter, an interconnecting member for a solar cell panel according to another embodiment of the invention and a solar cell panel including the same will be described in detail with reference to the accompanying drawings. Detailed descriptions will be omitted for the same or extremely similar parts as those described above, and only different parts will be described in detail. For example, the above description other than the interconnecting member may be applied to the solar cell panel, and the above description of the interconnecting member may be applied as it is to the interconnecting member in the case where there is no description that is different from the interconnecting member in the above embodiment. It is also within the scope of the invention to combine the above-described embodiments or modifications thereof with the following embodiments or modifications thereof.

Figure 11:
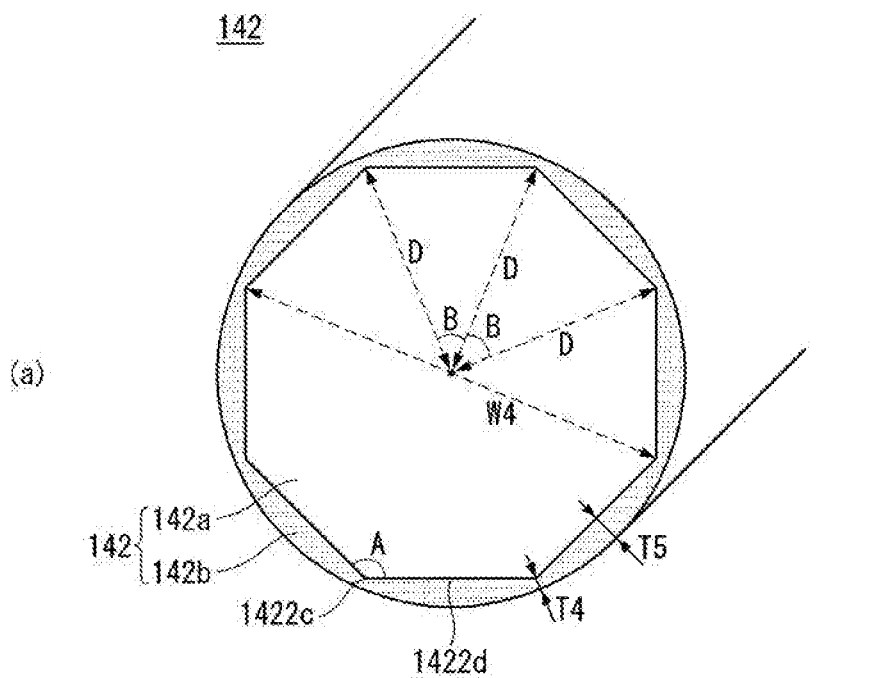
FIG. 11 is a perspective view showing shapes of an interconnecting member included in a solar cell panel according to another embodiment of the invention before and after an attaching process.
Figure 11:
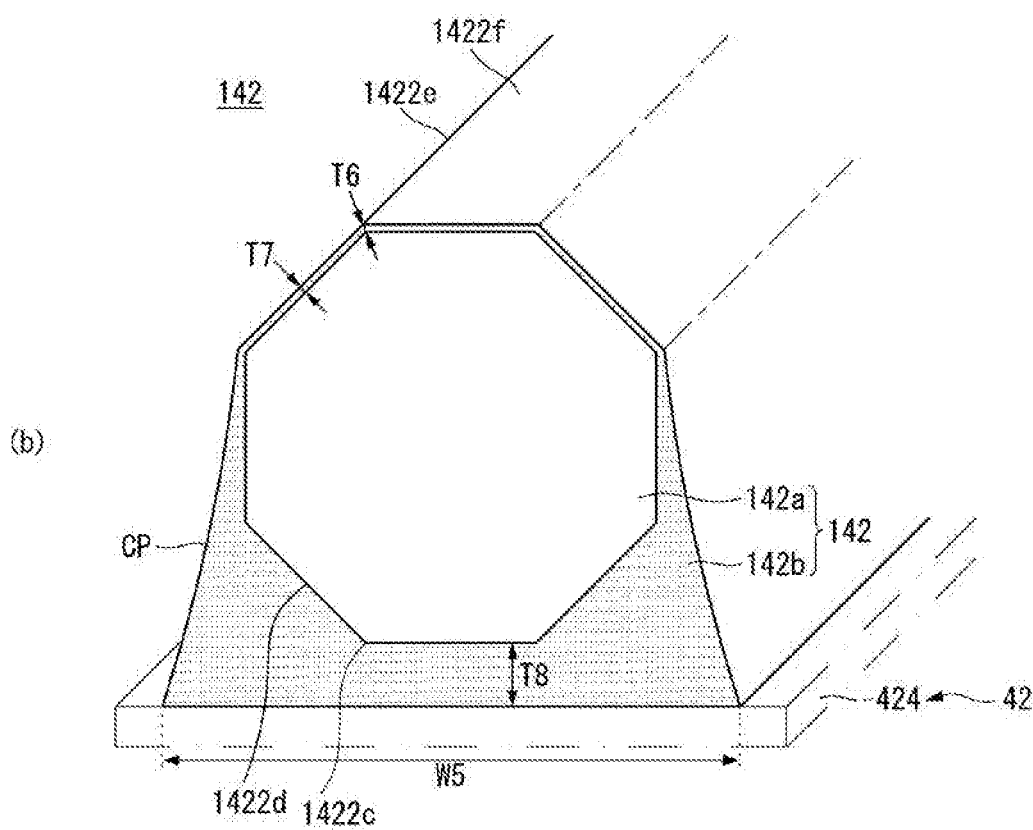
Figure 12:
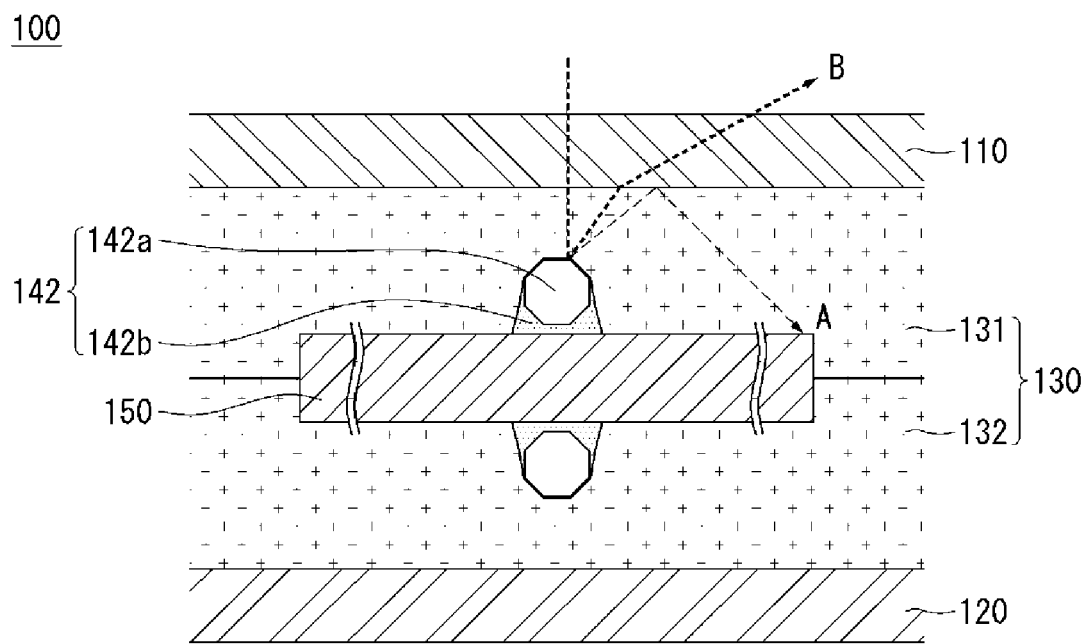
FIG. 12 is a schematic view showing a light reflection by the interconnecting member shown in FIG. 11.

FIG. 11 is a perspective view showing shapes of an interconnecting member included in a solar cell panel according to another embodiment of the invention before and after an attaching process. FIG. 12 is a schematic view showing a light reflection by the interconnecting member shown in FIG. 11. Particularly, in the embodiment, shapes of a solder layer 142b of the interconnecting member 142 before and after the attaching process may be different. Thus, a structure of the interconnecting member 142 before an attaching process will be described in detail with reference to FIG. 11(a) and then a structure of the interconnecting member 142 (particularly, a structure of the solder layer 142b) connected to a solar cell 150 after an attaching process will be described in detail with reference to FIG. 11(b). In this instance, boundaries of a first electrode 42 (particularly, a pad portion 424) to which the interconnecting member 142 is attached are also shown in FIG. 11(b) for reference.

Referring to FIG. 11(a), for example, a maximum width of an interconnecting member 142 may be 1 mm or less. In this instance, the maximum width of the interconnecting member 142 may mean the largest width among widths passing a center of the interconnecting member 142. When the interconnecting member 142 has the above maximum width, resistance of the interconnecting member 142 can be low and a light loss can be minimized, and the interconnecting member 142 can be stably attached to the solar cell 150.

In the embodiment, the interconnecting member 142 may include a core layer 142a formed of a metal, and a solder layer 142b formed on a surface of the core layer 142a and including a solder material. For example, the core layer 142a may include Ni, Cu, Au, Al or the like as a main material (for example, a material included with 50 wt % or more, or more specifically, a material included with 90 wt % or more). The solder layer 142b may include a solder material such as Pb, Sn, SnIn, SnBi, SnPb, SnPbAg, SnCuAg, or SnCu as a main material. However, embodiments of the invention are not limited thereto, and the core layer 142a and the solder layer 142b may include any of various materials.

In the embodiment, the core layer 142a may have a corner portion. The corner portion includes a peak portion or a corner portion extending in a longitudinal direction of the core layer 142a, and a reflection surface formed of inclined surfaces at both sides of the peak portion so that a width of the corner portion increases from the peak portion or the corner portion of the core layer 142a to a center of the core layer 142a. More specifically, the reflection surface connected to each peak portion may be formed of two inclined surfaces that cross each other, and the two inclined surfaces have an obtuse angle, thereby forming the obtuse-angled corner portion 1422c. The core layer 142a has a polygonal shape having a plurality of obtuse-angled corner portions 1422c in a cross-sectional view. That is, corners of the core layer 142a having the polygonal shape may be formed of the obtuse-angled corner portions 1422c, respectively. Then, a flat plane portion 1422d may be positioned between the two adjacent obtuse-angled corner portions 1422c among the obtuse-angled corner portions 1422c of the core layer 142a, respectively. That is, the flat plane portion 1422d may entirely connect the two adjacent obtuse-angled corner portions 1422c among the obtuse-angled corner portions 1422c of the core layer 142a. More specifically, the plurality of obtuse-angled corner portions 1422c have a shape extending parallel to a longitudinal direction of the interconnecting member 142, and the flat plane portion 1422d may be positioned between the two obtuse-angled corner portions 1422c adjacent to each other. That is, the two adjacent obtuse-angled corner portions 1422c among the obtuse-angled corner portions 1422c of the core layer 142a may be connected in a straight line in a cross-sectional view.

According to this, an amount of light incident to the solar cell 150 can be maximized by increasing the re-reflection at the first or second cover members 110 and 120. This will be described later with reference to FIG. 12. Also, an adhesion property and a fixing stability with the pad portion 424 can be improved. This will be described later in more detail with reference to FIG. 11(b). In addition, by increasing a contact area with an apparatus for handling (e.g., holding and fixing) the interconnecting member 142 by the flat plane portion 1422d, it is possible to improve ease of handling in various processes such as transferring, drawing, or so on of the interconnecting member 142. On the other hand, unlike the embodiment, in the circular shape without the flat plane portion, a contact area with the apparatus for handling the interconnecting member is small, and thus, the interconnecting member may be easily separated from the apparatus handling the interconnecting member.

Figure 13:
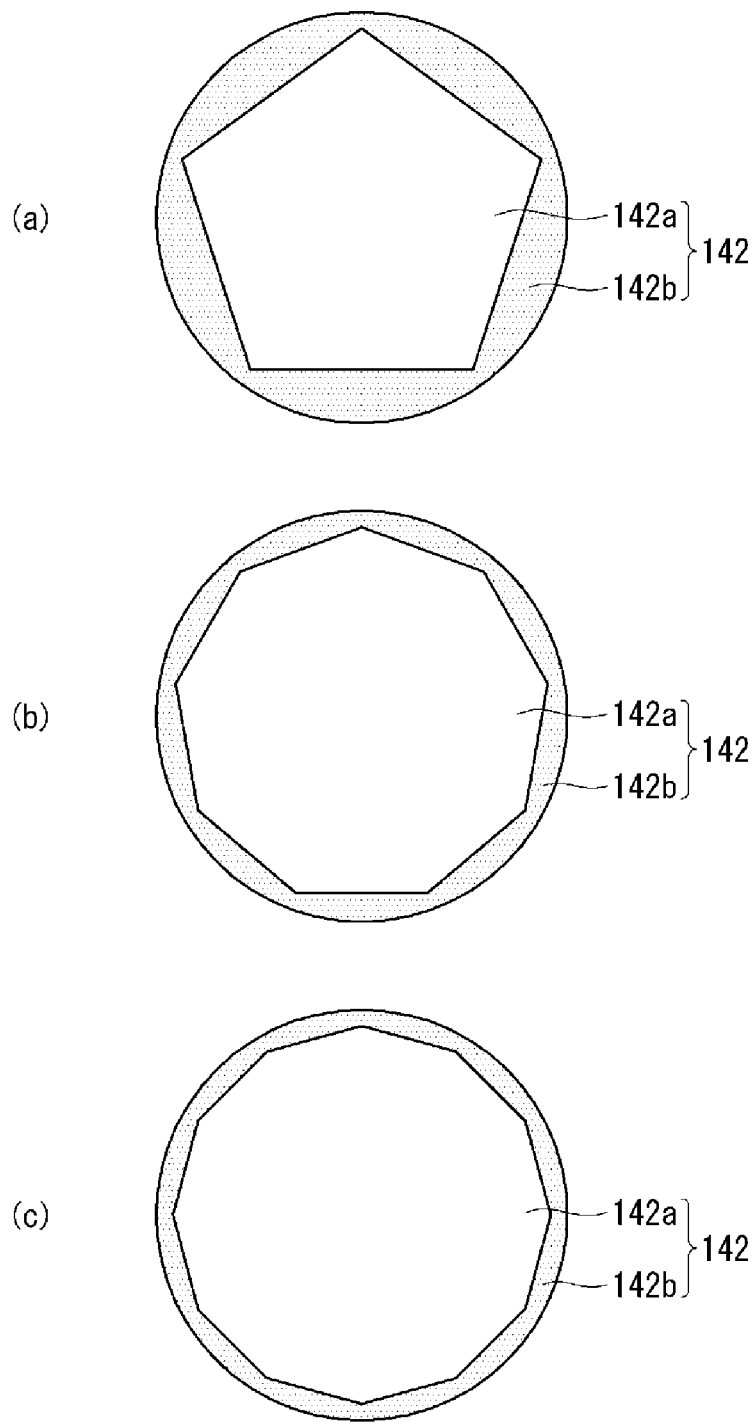
FIG. 13 is a cross-sectional view showing a shape of an interconnecting member included in a solar cell panel according to each of various modified embodiment of the invention before an attaching process.

For example, when viewed in a cross-section, the core layer 142a may include five to twelve obtuse-angled corner portions and has a pentagon shape to a dodecagon shape. It is exemplified that the core layer 142a has an octagonal shape in FIG. 11. However, as shown in FIGS. 13(a) to 13(c), a core layer 142a may have a pentagon shape, a nonagon shape, or a decagon shape. Although it is not shown, a core layer 142a may be a hexagon shape, a heptagon shape, an octagon shape, or a hendecagon shape. In one example, an angle A of the obtuse-angled corner portion 1422c may be between 108 degrees and 150 degrees, respectively. If a number of the obtuse-angled corner portions 1422c is less than 5, each of the corners may be not formed of the obtuse-angled corner portion 1422c. For example, in the case of a triangle shape or a quadrangle shape, at least one corner has a right angle or an acute angle, and a flat plane portion provided in a triangle shape or a quadrangle shape may be difficult to reflect the light at an angle such that the light can be re-reflected at the first or second cover member 110 or 120. If the number of the obtuse-angled corner portions 1422c exceeds 12, the effect of the obtuse-angled corner portions 1422c may not be sufficient.

In this instance, distances D from a center of the core layer 142a to the plurality of obtuse-angled corner portions 1422c are substantially the same, and center angles B between the two adjacent obtuse-angled corner portions 1422c may be substantially the same. That is, the core layer 142a may have a regular pentagon shape to a regular dodecagon shape. In this instance, the term of "the substantially same size" may mean that an error is within 10%. Thus, the core layer 142a may have a symmetrical shape or a regular shape. On the other hand, if an interconnecting member includes a core layer of a flat shape having a long axis in one direction and a short axis in another direction, re-reflection at the first or second cover member 110 or 120 may not occur sufficiently when the long axis direction is attached parallel to a plane of an electrode (that is, when it is flatly attached). On the other hand, a structural stability and a reliability may be deteriorated when the short axis direction is attached parallel to a plane of an electrode (e.g., the long axis direction is perpendicularly attached to the electrode).

In the embodiment, since the core layer 142a is formed of a single body and has a polygonal shape including an obtuse-angled corner portion 1422c having an obtuse angle, a manufacturing process is easy and simple, a manufacturing cost can be reduced, and a structural stability can be excellent. For example, the core layer 142a may be easily manufactured by a drawing process or the like.

The solder layer 142b may be formed while entirely covering an outer surface (a plurality of side surfaces) of the core layer 142a. The solder layer 142b may be formed on the core layer 142a by any of various methods. For example, a solder material constituting the solder layer 142b may be formed on an outer surface of the core layer 142a and dried to have a predetermined shape to form the solder layer 142b.

In the embodiment, an outer surface of the interconnecting member 142 (that is, an outer surface of the solder layer 142b) before an attaching process may include a rounded portion. That is, at least a portion of the outer surface of the solder layer 142b when viewed in a cross-section may include a circular shape, a part of a circular shape, an elliptical shape, a part of an elliptical shape, or a curved line.

Figure 14:
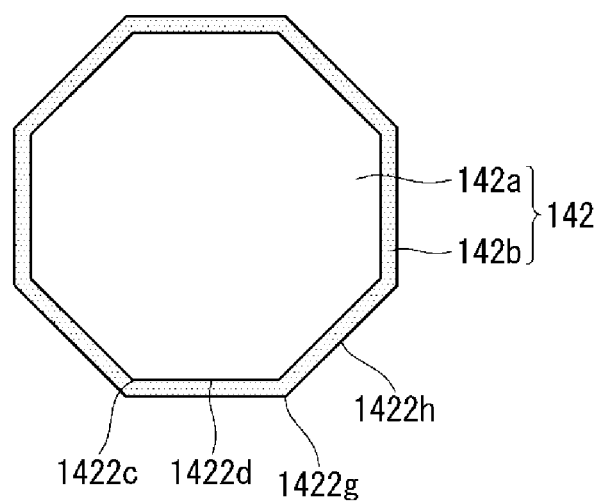
FIG. 14 is a cross-sectional view showing a shape of an interconnecting member included in a solar cell panel according to yet still another modified embodiment of the invention before an attaching process.

For example, when viewed in a cross-section, an outer surface of the solder layer 142b may have a circular shape. In this instance, a thickness T5 of the solder layer 142b located on the flat surface portion 1422d of the core layer 142a may be larger than a thickness T4 of the solder layer 142b located on the obtuse-angled corner portion 1422c of the core layer 142a. That is, the solder layer 142b may have a convex shape as a whole toward an outside. According to this shape, the solder layer 142b can be stably positioned on the core layer 142a by a surface tension or the like. However, embodiments of the invention are not limited thereto. As a modified embodiment, as shown in FIG. 14, the solder layer 142b has a polygonal shape having an obtuse-angled edge portion 1422g corresponding to the obtuse-angled corner portion 1422c of the core layer 142a, and a flat plane portion 1422h may be provided between the two adjacent obtuse-angled portions 1422g. Thus, the outer surface of the solder layer 142b may have the same or extremely similar shape as the outer surface of the core layer 142a. A thickness of the solder layer 142b located on the obtuse-angled corner portion 1422c of the core layer 142a and a thickness of the solder layer 142b located on the flat plane portion 1422d of the core layer 142a may be equal to each other, or may be different from each other. The solder layer 142b may be formed by controlling process conditions or the like using a mold having the same or similar planar shape as the core layer 142a and having a larger width or a larger area than the core layer 142a. Various other modifications are possible.

It is exemplified that a center of the solder layer 142b and a center of the core layer 142a are located at the same position and the solder layer 142b is uniformly and symmetrically located on an outer surface of the core layer 142a in FIG. 11. According to this, the solder layer 142b is uniformly positioned on the core layer 142a and thus an attaching property of the interconnecting member 142 can be improved. However, embodiments of the invention are not limited thereto. A center of the solder layer 142b and a center of the core layer 142a may be located at different positions, and the solder layer 142b may be relatively thick on one side of the core layer 142a and may be relatively thin on the other side of the core layer 142a.

A thickness of the solder layer 142b may be thinner than a width W4 of the core layer 142a. The width W4 of the core layer 142a may mean the largest diameter passing through a center of the core layer 142a and the thickness of the solder layer 142b may mean a minimum thickness of the solder layer 142b formed according to a design. The diameter W4 of the core layer 142a may be 200 to 600 µm (for example, 350 to 550 µm, for example, 350 to 500 µm) and the thickness of the solder layer 142b may be 1 to 10 µm (for example, 2 to 8 µm). Alternatively, a ratio of the thickness of the solder layer 142b to the width W4 of the core layer 142 may be 0.00001 to 0.2. This range is limited so that an attaching property by the solder layer 142b can be achieved while not increasing an amount of the solder layer 142b. However, embodiments of the invention are not limited thereto.

On the other hand, when the interconnecting member 142 is attached to the solar cell 150 by a tabbing process, a shape of the solder layer 142 may be changed at a portion of the interconnecting member 142 attached to or connected to the solar cell 150 as shown in FIG. 11(b). The shape of the solder layer 142b described below is a portion of the interconnecting member 142 attached to or connected to the solar cell 150.

More specifically, the interconnecting member 142 is attached to at least the pad portion 424 by the solder layer 142b. In this instance, the solder layer 142b of each interconnecting member 142 is separately and individually positioned with other interconnecting member 142 or other solder layer 142b. When the interconnecting member 142 is attached to the solar cell 150 by a tabbing process, each solder layer 142b entirely flows toward the first electrode 42 or the second electrode 44 (see FIG. 3) (more particularly, the pad portion 424) during the tabbing process. Then, a width of the solder layer 142b gradually increases toward the pad portion 424 at a portion adjacent to each pad portion 424 or at a portion located between the pad portion 424 and the core layer 142a. As an example, a portion of the solder layer 142b adjacent to the pad portion 424 may have a width W5 that is equal to or greater than a width W4 of the core layer 142a. In this instance, the width W5 of the solder layer 142b may be equal to or less than a width of the pad portion 424.

More specifically, a portion of the solder layer 142b on an upper portion of the core layer 142a has a protruded shape toward an outside of the solar cell 150 according to a shape of the core layer 142b (in particular, according to a shape of the plurality of obtuse-angled corner portions 1422c), and a flat plane portion 1422f may be provided between two adjacent obtuse-angled corner portions 1422c. On the other hand, another portion of the solder layer 142b positioned at a lower portion of the core layer 142a or adjacent to the pad portion 424 includes a portion having a concave shape toward an outside of the solar cell 150. In this instance, an inflection point CP at which a curvature changes may be located or may be not located at a side of the solder layer 142b.

In this instance, a thickness T8 of the solder layer 142b located between the pad portion 424 and the core layer 142a at a portion of the interconnecting member 142 attached to the solar cell 150 may be larger than a thickness T6 of the solder layer 142b located on the obtuse-angled corner portion 1422c of the protruding portion 1422, which is opposite to the portion of the interconnecting member 142 attached to the solar cell 150 (that is, which is positioned toward at an outside), and a thickness T7 of the solder layer 142b located on the flat plane portion 1422d. This is because the solder layer 142b flows down in a direction of the pad portion 424 in the tabbing process. It is exemplified that the thickness T6 of the solder layer 142b located on the obtuse-angled corner portion 1422c and the thickness T7 of the solder layer 142b located on the flat planar portion 1422d may be the same or similar (for example, within 10% error or tolerance) in the drawings. However, embodiments of the invention are not limited thereto.

In this instance, as shown in FIG. 11(b), the flat plane portion 1422d positioned between the two adjacent obtuse-angled corner portions 1422c of the core layer 142a may be closest to the pad portion 424 (e.g., parallel to a flat plane or an outer surface of the pad portion 424). Then, an area where the solder layer 142b is positioned between the core layer 142a and the pad portion 424 is widened and the solder layer 142b is provided with a sufficient volume between the core layer 142a and the pad portion 424, thereby improving an attaching force and a fixing stability of the interconnecting member 142. A solder layer 142b is formed with a relatively large volume between the core layer 142a and the pad portion 424 even when one flat plane portion 1422d of the core layer 142a is positioned closest to the pad portion 424 and is inclined to the pad portion 424, thereby improving the attaching force and the fixing stability. Even when one obtuse-angled corner portion 1422c of the core layer 142a is located closest to the pad portion 424 and two flat plane portions 1422d between the obtuse-angled corner portion 1422c are symmetrical with respect to each other, it may have an attaching force similar to that of a core layer having a circular shape. That is, when the core layer 142a having the polygonal shape as described above is provided, the core layer 142a may have an attaching force similar to or higher or better than that of a core layer having a circular shape. Particularly, the core layer 142a may have an attaching force higher or better than that of a core layer having a circular shape.

On the other hand, even after the tabbing process, a portion of the interconnecting member 142 located between the neighboring solar cells 150 (e.g., at an outside of the solar cell 150) where heat is not applied or relatively little heat is applied may have a shape as shown in FIG. 11(a). Accordingly, description of these portions will be omitted.

According to the embodiment, light reflected by the flat plane portion 1422d between the two adjacent obtuse-angled corner portions 1422c of the interconnecting member 142 is re-reflected by the first or second cover members 110 and 120 to be re-incident to the solar cell 150. That is, as shown by an arrow A in FIG. 12, the light reflected by the flat plane portion 1422d between the two adjacent obtuse-angled corner portions 1422c of the core layer 142a such that the light can be re-reflected (for example, total-reflected) by the first or second cover member 110 or 120 and an amount of the light re-incident to the solar cell 150 can be increased. Thus, the re-reflected light can be re-incident to the solar cell 150 and reused, and thus, an amount of light involved in photoelectric conversion can be maximized. On the other hand, unlike the embodiment, if a core layer has a circular shape without an obtuse-angled corner portion, even if reflection occurs due to the core layer as shown by an arrow B in FIG. 12, it may be difficult to contribute to perform photoelectric conversion because light is reflected at an angle that may be not total-reflected at the first or second cover member 110 or 120. Thus, light may be not effectively reused.

Thus, even when the interconnecting member 142 having a small width is used, an amount of light incident to the solar cell 150 can be maximized by the re-reflection at the first or second cover member 110 or 120. Thus, an output of the solar cell panel 100 can be improved.

Figure 15:
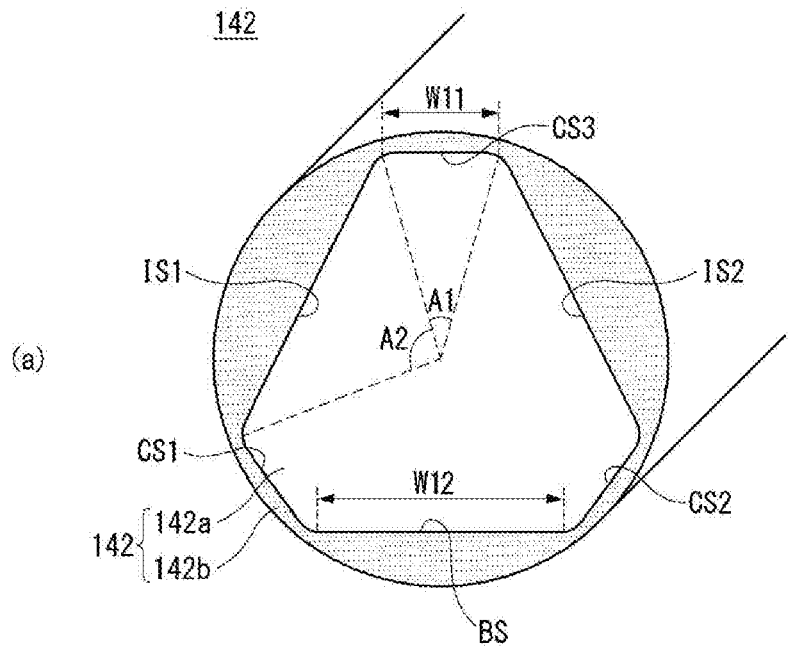
FIG. 15 is a perspective view showing shapes of an interconnecting member included in a solar cell panel according to yet another embodiment of the invention before and after an attaching process.
Figure 15:
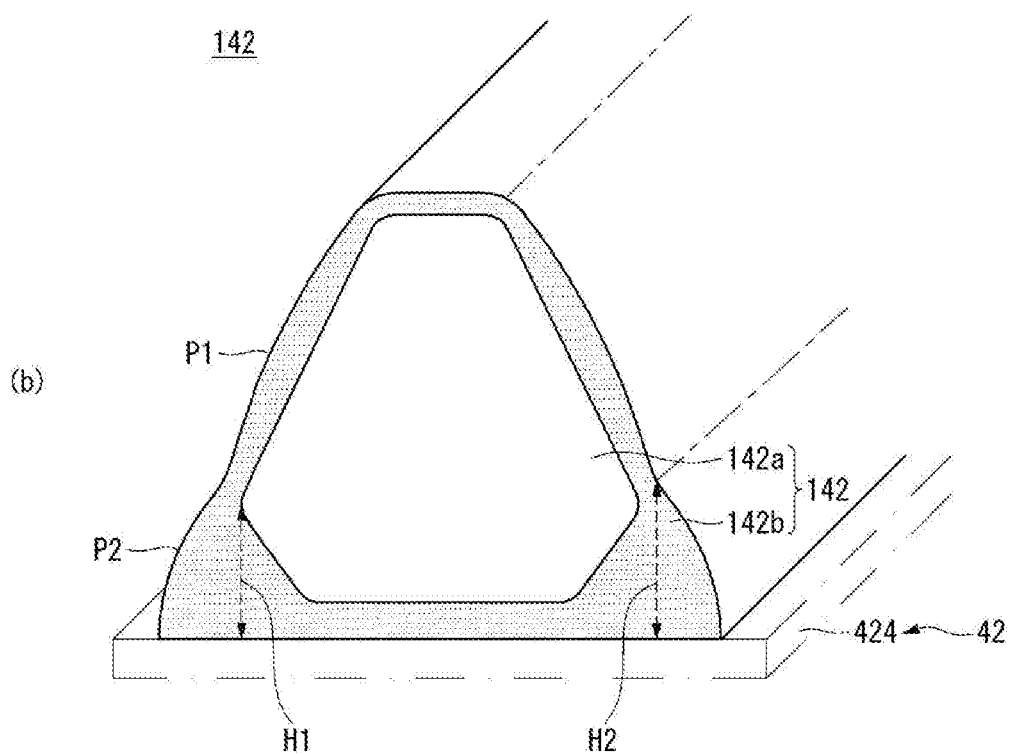

FIG. 15 is a perspective view showing shapes of an interconnecting member included in a solar cell panel according to yet another embodiment of the invention before and after an attaching process. Particularly, in the embodiment, shapes of a solder layer 142b of the interconnecting member 142 before and after the attaching process may be different. Thus, a structure of the interconnecting member 142 before an attaching process will be described in detail with reference to FIG. 15(a) and then a structure of the interconnecting member 142 (particularly, a structure of the solder layer 142b) connected to a solar cell 150 after an attaching process will be described in detail with reference to FIG. 15(b). In this instance, boundaries of a first electrode 42 (particularly, a pad portion 424) to which the interconnecting member 142 is attached are also shown in FIG. 15(b) for reference. Hereinafter, the above description may be applied as it is to the interconnecting member according to the embodiment shown in FIG. 15 in the case where there is no description that is different from the interconnecting member according to the embodiment shown in FIG. 11. In the following description, the first electrode 42 is used as a reference, but the description of the first electrode 42 may be applied to a second electrode.

Referring to FIG. 15, in the embodiment, a core layer 142a includes a base surface BS, first and second corner surfaces CS1 and CS2, first and second inclined reflection surfaces IS1 and IS2, and a third corner surface CS3. The first and second corner surfaces CS1 and CS2 are connected to both sides of the base surface BS, and a distance between the first and second corner surfaces CS1 and CS2 increases as a distance to the base surface BS increases. The first and second inclined reflection surfaces IS1 and IS2 are connected to the first and second corner surfaces CS1 and CS2, respectively, and are inclined in opposite directions to each other so that a distance between the first and second inclined reflection surfaces CS1 and CS2 decreases as a distance to the base surface BS increases. In this instance, the third corner surface CS3 constitutes a peak portion, the first and second inclined reflection surfaces IS1 and IS2 constitute a reflection surface located on both sides of the peak portion. Thus, the third corner surface CS3, and first and second inclined reflection surfaces IS1 and IS2 may constitute a kind of corner portion.

Accordingly, the core layer 142a may have a hexagon shape, not a regular hexagon shape. In this instance, the core layer 142a may have a hexagonal shape having a symmetrical structure. In this instance, the phrase of "the core layer 142a has the symmetrical structure" may mean that the first, second, and third corner surfaces CS1, CS2 and CS3 may have the same width as a first width W11, the base surface BS and the first and second inclined reflection surfaces IS1 and IS2 may have the same width as a second width W12 different from the first width W11. In this instance, the first width W11 or the second width W12 may mean a straight distance between both ends of the first, second, or third corner surface CS1, CS2, or CS3, the base surface BS, or the first or second inclined reflection surface IS1 or IS2 in a cross-section perpendicular to a longitudinal direction of the interconnecting member 142. Alternatively, the phrase of "the core layer 142a has the symmetrical structure" may mean that angles between imaginary lines connecting a center of the core layer 142a and both ends of the first, second, and third corner surface CS1, CS2, and CS3 are the same as a first angle A1, angles between imaginary lines connecting the center of the core layer 142a and both ends of the base surface BS, and the first and second inclined reflection surfaces IS1 or IS2 are the same as a second angle A2, and the base surface BS and the third corner surface CS3, the first inclined reflection surface IS1 and the second corner surface CS2, and the second inclined reflection surface IS2 and the first corner surface CS1 are parallel to each other. In this instance, the phrase of "widths or angles are the same or substantially the same" may mean that it can be regarded as being substantially the same within an error of 10% or less.

In this instance, widths W11 of the first, second, and third corner surfaces CS1, CS2, and CS3 are smaller than widths W12 of the first and second inclined reflection surfaces IS1 and IS2, and the base surface BS. As a result, an area of the base surface BS is sufficiently secured to increase a contact area of a pad portion 424 of a first electrode 42, thereby improving a contact property. Also, an area of the first and second inclined reflection surfaces IS1 and IS2 is sufficiently ensured to sufficiently reflect light at the interconnecting member 142 or the core layer 142a such that the re-incidence of the light by the light reflection (for example, the total reflection of the light) at the first or second cover member 110 or 120 can be induced, thereby improving an output of a solar cell panel 100.

For example, a ratio W11/W12 of the first width W11 to the second width W12 may be 0.1 to 0.9 (for example, 0.2 to 0.8). If the above ratio W11/W12 is less than 0.1, the first width W11 of the first, second, or third corner faces CS1, CS2, or CS3 is not sufficient and a contact property between the interconnecting member 142 and the pad portion 424 may be deteriorated when a corner portion on which the corner surface CS1, CS2, or CS3 is provided is located toward the pad portion 424 of the first electrode 42. In particular, the corner surface or the corner portion may have an angular shape or an angled shape, and thus, a contact property may be deteriorated. If the above ratio W11/W12 exceeds 0.9, the second width W12 of the first or second inclined reflection surface IS1 or IS2 or the base surface BS may be not sufficient, and thus, the effect of the first or second inclined reflection surface IS1 or IS2 or the base surface BS may not be sufficient. When the above ratio W11/W12 is in a range of 0.2 to 0.8, effects by the first, second, and third corner faces CS1, CS2, and CS3, first and second inclined reflection surfaces IS1 and IS2, and the base surface BS can be maximized.

In the embodiment, since the core layer 142a is formed of a single body and a hexagonal shape with the above symmetrical structure, a manufacturing process is easy and simple, a manufacturing cost can be reduced, and a structural stability can be excellent. For example, the core layer 142a may be easily manufactured by a drawing process or the like.

The solder layer 142b may be formed while entirely covering an outer surface (a plurality of side surfaces) of the core layer 142a. The solder layer 142b may be formed on the core layer 142a by any of various methods. For example, a solder material constituting the solder layer 142b may be formed on an outer surface of the core layer 142a and dried to have a predetermined shape to form the solder layer 142b.

In the embodiment, an outer surface of the interconnecting member 142 (that is, an outer surface of the solder layer 142b) before an attaching process may include a rounded portion. That is, at least a portion of the outer surface of the solder layer 142b when viewed in a cross-section may include a portion of a circular shape, a part of a circular shape, an elliptical shape, a part of elliptical shape, or a curved line.

For example, when viewed in a cross-section, an outer surface of the solder layer 142b may have a circular shape. In this instance, a thickness (for example, an average thickness) of the solder layer 142b located on the base surface BS, and first and second inclined reflection surfaces IS1 and IS2 may be larger than a thickness (for example, an average thickness) of the solder layer 142b located on the first, second, and third corner surfaces CS1, CS2, and CS3. That is, the solder layer 142b may have a convex shape as a whole toward an outside. According to this shape, the solder layer 142b can be stably positioned on the core layer 142a by a surface tension or the like. However, embodiments of the invention are not limited thereto. As a modified embodiment, an outer surface of a solder layer 142b may have the same or extremely similar shape as an outer surface of a core layer 142a. A thickness (for example, an average thickness) of the solder layer 142b located on the base surface BS, and first and second inclined reflection surfaces IS1 and IS2 may be the same as or be different from a thickness (for example, an average thickness) of the solder layer 142b located on the first, second, and third corner surfaces CS1, CS2, and CS3. The solder layer 142b may be formed by controlling process conditions or the like using a mold having the same or similar planar shape as the core layer 142a and having a larger width or a larger area than the core layer 142a. Various other modifications are possible.

It is exemplified that a center of the solder layer 142b and a center of the core layer 142a are located at the same position and the solder layer 142b is uniformly and symmetrically located on an outer surface of the core layer 142a in FIG. 15. According to this, the solder layer 142b is uniformly positioned on the core layer 142a and thus an attaching property of the interconnecting member 142 can be improved. However, embodiments of the invention are not limited thereto. A center of the solder layer 142b and a center of the core layer 142a may be located at different positions, and the solder layer 142b may be relatively thick on one side of the core layer 142a and may be relatively thin on the other side of the core layer 142a.

On the other hand, when the interconnecting member 142 is attached to the solar cell 150 by a tabbing process, a shape of the solder layer 142 may be changed at a portion of the interconnecting member 142 attached to or connected to the solar cell 150 as shown in FIG. 15(b). The shape of the solder layer 142b described below is a portion of the interconnecting member 142 attached to or connected to the solar cell 150.

More specifically, the interconnecting member 142 is attached to at least the pad portion 424 by the solder layer 142b. In this instance, the solder layer 142b of each interconnecting member 142 is separately and individually positioned with other interconnecting member 142 or other solder layer 142b. When the interconnecting member 142 is attached to the solar cell 150 by a tabbing process, each solder layer 142b entirely flows toward the first electrode 42 (more particularly, the pad portion 424) during the tabbing process. Then, a width of the solder layer 142b gradually increases toward the pad portion 424 at a portion adjacent to each pad portion 424 or at a portion located between the pad portion 424 and the core layer 142a. As an example, the solder layer 142b may include a first portion P1 having a rounded shape and covering the third corner surface CS3 and the first and second inclined reflection surfaces IS1 and IS2, and a second portion P2 formed at a portion where the first and second inclined reflection surfaces CS1 and CS2 and the base surface BS are located and having a shape protruding outward than the first portion P1. An entire portion of the first portion P1 may have a rounded shape (for example, a protruding shape having a convex portion toward a front surface) so as to reduce light that is extinguished by a regular reflection and to increase an amount of light directed toward the solar cell 150. The second portion P2 may have a curvature different from (e.g. smaller than) a curvature of the first portion P1. Alternatively, a degree that a width of the second portion P2 increases toward to the pad portion 424 may be greater than a degree that a width of the first portion P1 increases toward to the pad portion 424, and thus, the second portion P2 may protrude outwardly more than the first portion P1. A height H1 of a boundary between the first portion P1 and the second portion P2 (that is, a distance between the boundary between the first portion P1 and the second portion P2 and the pad portion 424) may be higher or larger than a height H2 of the first or second corner surface CS1 or CS2 (e.g., a distance between an upper portion of the first or second corner surface CS1 or CS2 and the pad portion 424). Then, the second portion P2 has a sufficient height or thickness to improve a contact property. However, embodiments of the invention are not limited thereto. The height H2 of the boundary between the first portion P1 and the second portion P2 may be equal to or less than the height H1 of the first and second corner surfaces CS1 and CS2.

On the other hand, even after the tabbing process, a portion of the interconnecting member 142 located between the neighboring solar cells 150 (e.g., at an outside of the solar cell 150) where heat is not applied or relatively little heat is applied may have a shape as shown in FIG. 15(a). Accordingly, description of these portions will be omitted.

According to the embodiment, the core layer 142a has a large contact area by the base surface BS and the first and second inclined reflection surfaces IS1 and IS2 having the relatively large second width W12, thereby improving a contact property and sufficiently realizing light reflection. The core layer 142a may include first to third corner surfaces CS1, CS2 and CS3 between the base surface BS and the first and second inclined reflection surfaces IS1 and IS2, and thus, a problem such as deterioration of a contact property can be prevented. Thus, an output and a reliability of a solar cell panel 100 can be improved.

In the above description, the base surface BS and the first and second inclined reflection surfaces IS1 and IS2 are used only for distinguishing each other, but embodiments of the invention are not limited thereto. That is, a surface having a relatively large second width W12 adjacent to or facing the pad portion 424 after the tabbing process is referred to as a base surface BS, and two surfaces located opposite to the pad portion 424 and having a relatively large second width W12 are referred to as first and second inclined reflection surfaces IS1 and IS2.

Figure 16:
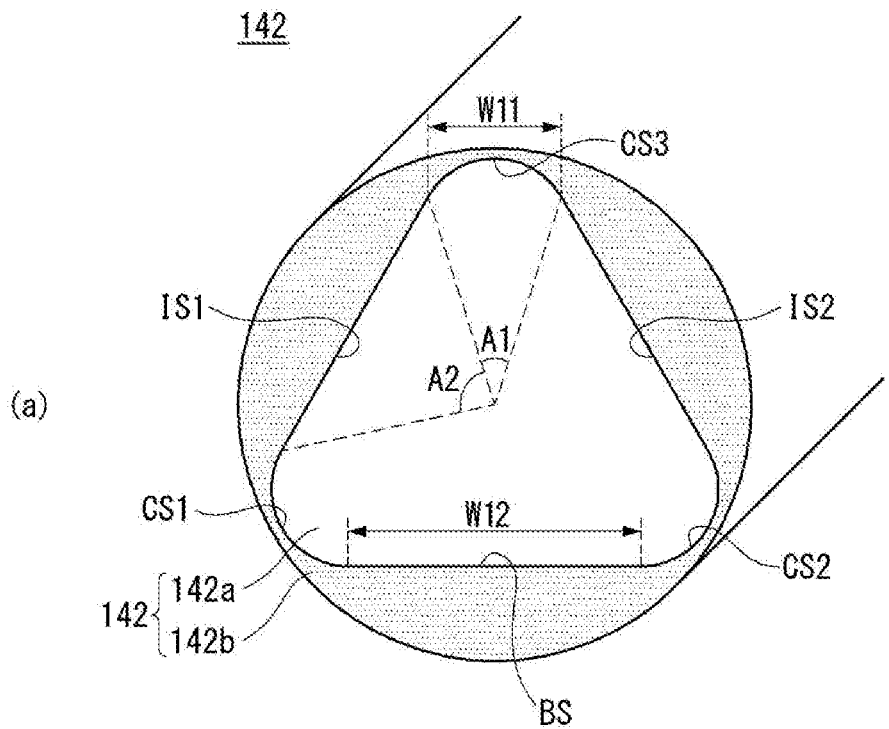
FIG. 16 is a perspective view showing shapes of an interconnecting member included in a solar cell panel according to yet still another modified embodiment of the invention before and after an attaching process.
Figure 16:
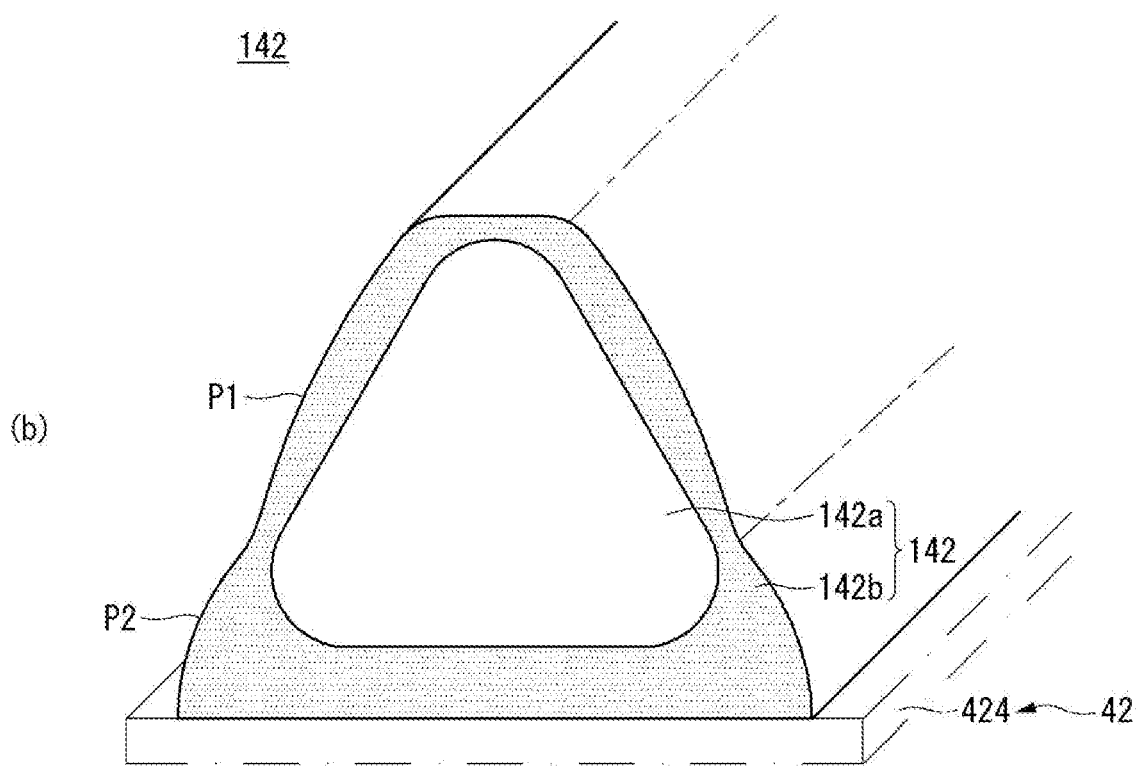

In FIG. 15, it is exemplified that each of the first to third corner surfaces CS1, CS2, and CS3 have a flat plane portion, and both sides of the flat plane portion are connected to the base plane BS, and the first and second inclined reflection surface IS1 and IS2 to have a rounded shape. When the first to third corner surfaces CS1, CS2, and CS3 have flat plane portions, even when the first to third corner surfaces CS1, CS2, and CS3 are disposed adjacent to the pad portion 424, it is possible to realize the minimum contact property between the interconnecting member 142 and the pad portion 424. As another example, as shown in FIG. 16, first to third corner surfaces CS1, CS2, and CS3 may be formed of a curved surface as a whole. The core layer 142a having the structure and the interconnecting member 142 including the core layer 142a can be easily manufactured. However, embodiments of the invention are not limited thereto, and various other modifications are possible.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. An interconnecting member of a solar cell panel for connecting a plurality of solar cells, the interconnecting member comprising:
a core layer; and
a solder layer formed on a surface of the core layer,
wherein the core layer has a peak portion extending along a longitudinal direction of the core layer,
wherein the core layer includes a base surface, first and second corner surfaces, a reflection surface including first and second inclined reflection surfaces, and a third corner surface,
wherein the first and second corner surfaces are connected to two sides of the base surface, and a distance between the first and second corner surfaces increases as a distance to the base surface increases,
wherein the first and second inclined reflection surfaces are connected to the first and second corner surfaces, respectively, and are inclined in opposite directions to each other so that a distance between the first and second inclined reflection surfaces decreases as a distance to the base surface increases,
wherein the third corner surface connects the first and second inclined reflection surfaces, is parallel to the base surface, and forms the peak portion,
wherein a first width of the base surface is greater than a second width of the third corner surface, and
wherein the first width and the second width are orthogonal to the longitudinal direction of the core layer.

2. The interconnecting member of claim 1, wherein the first and second corner surfaces form the peak portion.

3. The interconnecting member of claim 1,
wherein widths of the first, second, and third corner surfaces are smaller than widths of the first and second inclined reflection surfaces.

4. The interconnecting member of claim 1, wherein the first, second, and third corner surfaces have widths equal to each other,
wherein the first and second inclined reflection surfaces and the base surface have widths equal to each other, and
wherein the interconnecting member has a symmetrical structure.

5. The interconnecting member of claim 4, wherein a ratio of the width of the first, second, or third corner surface to the width of the first or second inclined reflection surface is approximately 0.1 to 0.9.

6. A solar cell panel, comprising:
a plurality of solar cells; and
an interconnecting member connecting the plurality of solar cells, wherein the interconnecting member includes a core layer and a solder layer formed on a surface of the core layer, wherein the core layer has a peak portion extending along a longitudinal direction of the core layer, wherein the core layer includes a base surface, first and second corner surfaces, a reflection surface including first and second inclined reflection surfaces, and a third corner surface, wherein the first and second corner surfaces are connected to two sides of the base surface, and a distance between the first and second corner surfaces increases as a distance to the base surface increases, wherein the first and second inclined reflection surfaces are connected to the first and second corner surfaces, respectively, and are inclined in opposite directions to each other so that a distance between the first and second inclined reflection surfaces decreases as a distance to the base surface increases, wherein the third corner surface connects the first and second inclined reflection surfaces, is parallel to the base surface, and forms the peak portion, wherein a first width of the base surface is greater than a second width of the third corner surface, and wherein the first width and the second width are orthogonal to the longitudinal direction of the core layer.

7. The solar cell panel of claim 6, wherein the first and second corner surfaces form the peak potion.

8. The solar cell panel of claim 6, wherein widths of the first, second, and third corner surfaces are smaller than widths of the first and second inclined reflection surfaces.

9. The solar cell panel of claim 6, wherein the first, second, and third corner surfaces have widths equal to each other, wherein the first and second inclined reflection surfaces and the base surface have widths equal to each other, and wherein the interconnecting member has a symmetrical structure.

10. The solar cell panel of claim 9, wherein a ratio of the width of the first, second, or third corner surface to the width of the first or second inclined reflection surface is approximately 0.1 to 0.9.

11. The solar cell panel of claim 6, wherein each of the plurality of solar cells includes a photoelectric conversion portion, and an electrode formed on the photoelectric conversion portion and including a pad portion attached to the interconnecting member, wherein the base surface is disposed adjacent to the pad portion.

12. The interconnecting member of claim 1, wherein the core layer has a hexagon rod shape.

13. The interconnecting member of claim 1, wherein a cross section of the core layer has a plurality of long sides and a plurality of short sides adjacent to the plurality of long sides, each of the plurality of long sides being longer than one of the plurality of short sides.

14. The interconnecting member of claim 13, wherein the plurality of long sides are of equal length, and the plurality of short sides are of equal length.

15. The interconnecting member of claim 13, wherein the plurality of long sides correspond to the base surface, the first inclined reflection surface and the second inclined reflection surface, and the plurality of short sides correspond to the first, second and third corner surfaces.

16. The interconnecting member of claim 1, wherein a width of each of the base surface, the first inclined reflection surface and the second inclined reflection surface is greater than a width of each of the first, second and third corner surfaces.

17. The solar cell panel of claim of claim 6, wherein the core layer has a hexagon rod shape.

18. The solar cell panel of claim of claim 6, wherein a cross section of the core layer has a plurality of long sides and a plurality of short sides adjacent to the plurality of long sides, each of the plurality of long sides being longer than one of the plurality of short sides.

19. The solar cell panel of claim of claim 18, wherein the plurality of long sides are of equal length, and the plurality of short sides are of equal length.

20. The solar cell panel of claim 6, wherein a width of each of the base surface, the first inclined reflection surface and the second inclined reflection surface is greater than a width of each of the first, second and third corner surfaces.

* * * * *